(12) United States Patent  
Zhou et al.

(10) Patent No.: US 8,860,137 B2  
(45) Date of Patent: Oct. 14, 2014

(54) RADIO FREQUENCY DEVICES BASED ON CARBON NANOMATERIALS

(75) Inventors: Chongwu Zhou, Arcadia, CA (US); Koungmin Ryu, Los Angeles, CA (US); Alexander Badmaev, Hillsboro, OR (US); Chuan Wang, Albany, CA (US)

(73) Assignee: University of Southern California, Los Angeles, CA (US)

( * ) Notice: Subject to any disclaimer, the term of this patent is extended or adjusted under 35 U.S.C. 154(b) by 0 days.

(21) Appl. No.: 13/492,547

(22) Filed: Jun. 8, 2012  
(Under 37 CFR 1.47)

(65) Prior Publication Data  
US 2013/0119348 A1 May 16, 2013

Related U.S. Application Data

(60) Provisional application No. 61/494,765, filed on Jun. 8, 2011.

(51) Int. Cl.  
*H01L 27/12* (2006.01)  
*H01L 51/00* (2006.01)  
*H01L 51/05* (2006.01)  
*H01L 29/66* (2006.01)  
*B82Y 40/00* (2011.01)  
*H01L 29/775* (2006.01)  
*B82Y 10/00* (2011.01)

(52) U.S. Cl.  
CPC .......... *H01L 29/775* (2013.01); *H01L 51/0003* (2013.01); *H01L 51/0048* (2013.01); *H01L 51/0541* (2013.01); *B82Y 10/00* (2013.01); *H01L 29/66477* (2013.01); *B82Y 40/00* (2013.01)  
USPC ............................ 257/347; 438/197; 438/276

(58) Field of Classification Search  
USPC ................................ 257/29, 24; 438/197, 276  
See application file for complete search history.

(56) References Cited

U.S. PATENT DOCUMENTS

| | | | |
|---|---|---|---|
| 5,559,349 A * | 9/1996 | Cricchi et al. | ................. 257/273 |
| 6,333,016 B1 * | 12/2001 | Resasco et al. | ............. 423/447.3 |
| 6,361,861 B2 | 3/2002 | Gao et al. | |
| 6,440,761 B1 | 8/2002 | Choi | |
| 6,646,598 B1 | 11/2003 | Timothy et al. | |
| 6,756,026 B2 | 6/2004 | Colbert et al. | |
| 6,882,051 B2 | 4/2005 | Majumdar et al. | |
| 7,160,532 B2 | 1/2007 | Liu et al. | |
| 7,288,321 B2 | 10/2007 | Liu et al. | |

(Continued)

FOREIGN PATENT DOCUMENTS

| | | |
|---|---|---|
| WO | WO 2011/137404 | 11/2011 |
| WO | WO 2012/135380 | 10/2012 |

OTHER PUBLICATIONS

L. Nougaret, "80 GHz field-effect transistors produced using high purity semiconducting single-walled carbon nanotubes", Jun. 17, 2009, Applied Physics Letters 94, pp. 243505-1-243505-3.*

(Continued)

*Primary Examiner* — Allen Parker  
(74) *Attorney, Agent, or Firm* — Fish & Richardson P.C.

(57) ABSTRACT

RF transistors are fabricated at complete wafer scale using a nanotube deposition technique capable of forming high-density, uniform semiconducting nanotube thin films at complete wafer scale, and electrical characterization reveals that such devices exhibit gigahertz operation, linearity, and large transconductance and current drive.

21 Claims, 19 Drawing Sheets

(56) References Cited

U.S. PATENT DOCUMENTS

| | | | |
|---|---|---|---|
| 7,338,554 B2 | 3/2008 | Delaunay et al. | |
| 7,394,118 B2 | 7/2008 | Zhou | |
| 7,419,651 B2 | 9/2008 | Smalley et al. | |
| 7,438,844 B2 | 10/2008 | Huang et al. | |
| 7,511,206 B2 | 3/2009 | Hiraoka et al. | |
| 7,576,971 B2 | 8/2009 | Lipka et al. | |
| 7,662,652 B2 | 2/2010 | Zhou | |
| 7,687,876 B2 | 3/2010 | Kabir | |
| 7,834,530 B2 | 11/2010 | Manohara et al. | |
| 7,858,454 B2 | 12/2010 | Kalburge | |
| 8,066,842 B2 | 11/2011 | Farmet et al. | |
| 8,106,430 B2 * | 1/2012 | Cho et al. | 257/288 |
| 8,187,746 B2 | 5/2012 | Chen et al. | |
| 8,324,087 B2 * | 12/2012 | Zhou et al. | 438/509 |
| 8,354,291 B2 | 1/2013 | Zhou | |
| 2002/0130311 A1 | 9/2002 | Lieber et al. | |
| 2003/0107065 A1 | 6/2003 | Taniguchi et al. | |
| 2004/0036128 A1 * | 2/2004 | Zhang et al. | 257/401 |
| 2004/0043219 A1 | 3/2004 | Ito et al. | |
| 2004/0240156 A1 | 12/2004 | Norton et al. | |
| 2005/0189883 A1 | 9/2005 | Suh et al. | |
| 2006/0113510 A1 * | 6/2006 | Luo et al. | 252/500 |
| 2008/0008844 A1 | 1/2008 | Bettge et al. | |
| 2008/0158778 A1 | 7/2008 | Lipka et al. | |
| 2008/0182369 A1 | 7/2008 | Jeong et al. | |
| 2008/0247118 A1 | 10/2008 | Long et al. | |
| 2008/0261342 A1 | 10/2008 | Zhou | |
| 2008/0292840 A1 | 11/2008 | Majumdar et al. | |
| 2009/0045061 A1 | 2/2009 | Farrow et al. | |
| 2009/0061315 A1 | 3/2009 | Nakano et al. | |
| 2009/0085063 A1 | 4/2009 | Makiyama et al. | |
| 2009/0224230 A1 * | 9/2009 | Pesetski et al. | 257/24 |
| 2009/0278111 A1 | 11/2009 | Pop | |
| 2010/0065818 A1 | 3/2010 | Kim et al. | |
| 2010/0127242 A1 | 5/2010 | Zhou et al. | |
| 2010/0133511 A1 * | 6/2010 | Zhou et al. | 257/24 |
| 2010/0140665 A1 * | 6/2010 | Singbal et al. | 257/204 |
| 2010/0173462 A1 * | 7/2010 | Appenzeller et al. | 438/276 |
| 2010/0295097 A1 * | 11/2010 | Takenaka et al. | 257/194 |
| 2011/0073837 A1 | 3/2011 | Zhou | |
| 2011/0101302 A1 | 5/2011 | Zhou et al. | |
| 2011/0229777 A1 | 9/2011 | Mak et al. | |
| 2011/0235240 A1 | 9/2011 | Lu et al. | |
| 2011/0262772 A1 | 10/2011 | Hauge et al. | |
| 2011/0269967 A1 * | 11/2011 | Shukla et al. | 546/110 |
| 2011/0277813 A1 | 11/2011 | Rogers et al. | |
| 2011/0304953 A1 | 12/2011 | Zhou | |
| 2011/0304955 A1 | 12/2011 | Zhou | |
| 2012/0248416 A1 | 10/2012 | Zhou et al. | |
| 2012/0261646 A1 | 10/2012 | Zhou et al. | |

OTHER PUBLICATIONS

Artukovic et al., "Transparent and Flexible Carbon Nanotube Transistors," 2005, *Nano Lett.* 5(4):757-760, 4 pages.
Avouris et al., "Carbon nanotubes: nanomechanics, manipulation, and electronic devices," 1999, *Applied Surface Science* 141(304):201-209, 9 pages.
Avouris et al., "Carbon-Based Electronics," Oct. 2007, *Nature Nanotechnology*, 2:605-615, 11 pages.
Avouris, P., Graphene: Electronic and Photonic Properties and Devices, 2010, *Nano Letters*, 10:4285-4294.
Bachilo et al., "Narrow (n,m)-Distribution of Single-Walled Carbon Nanotubes Grown Using a Solid Supported Catalyst," 2003, *Journal of the American Chemical Society*, 125(37):11186-11187.
Bae et al., "Roll-to-roll production of 30-inch graphene films for transparent electrodes," *Nature Nanotechnol*, Jun. 2010, 5:574-578.
Bohr, "Nanotechnology Goals and Challenges for Electronic Applications," Mar. 2002, *IEEE Transactions on Nanotechnology*, 1(1):56-62.
Buffa et al., "Side-Wall Functionalization of Single-Walled Carbon Nanotubes with 4-Hydroxymethylaniline Followed by Polymerization of -Caprolactone,"2005, *Macromolecules*, 38, 8258-8263, 6 pages.

Cao et al., "Gate Capacitance Coupling of Singled-Walled Carbon Nanotube Thin Film Transistors," 2007, *Appl. Phys. Lett.*, vol. 90, 023516-1-023516-3, 4 pages.
Cao et al., "Ultrathin Films of Single-Walled Carbon Nanotubes for Electronics and Sensors: A Review of Fundamental and Applied Aspects," *Advanced Materials*, 2009, 21, 29-53, 25 pages.
Chan et al., "Oxidation of Carbon Nanotubes by Singlet O2," Feb. 28, 2003, *Physical Review Letters*, 90(8):86403-1-4 (2003), 4 pages.
Chattopadhyay et al., "A Route for Bulk Separation of Semiconducting from Metallic Single-Wall Carbon Nanotubes," 2003, *J. Am. Chem. Soc.*, 125, 3370-3375, 6 pages.
Chen et al., "Bulk Separative Enrichment in Metallic or Semiconducting Single-Walled Carbon Nanotubes," 2003, *Nano Letters*, 3(9):1245-1249, 5 pages.
Chen et al., "Chemically Doped Double-Walled Carbon Nanotubes: Cylindrical Molecular Capacitors," Jun. 27, 2003, *Physical Review Letters*, 90(25):257403-1-257403-1, 4 pages.
Chen et al., "Novel Method of Converting Metallic-Type Carbon Nanotubes to Semiconducting-Type Carbon Nanotube Field-Effect Transistors," 2006, *Japanese Journal of Applied Physics* 45(4B):3680-3685, 6 pages.
Chen et al., "Toward the Extraction of Single Species of Single-Walled Carbon Nanotubes Using Fluorene-Based Polymers," 2007, *Nano Letters* 7, 3013, 5 pages.
Derycke et al., "Controlling doping and carrier injection in cabon nanotube transistors," Appl. Phys. Lett., 80:2773-2775 (2002).
Dimitrakopoulos et al., "Organic Thin-Film Transistors: A Review of Recent Advances," 2001, *IBM J. Res. Dev.*, 45, 11-27, 17 pages.
Ding et al., "Self-aligned U-gate carbon nanotube field-effect transistor with extremely small parasitic capacitance and drain-induced barrier lowering," *ACS Nano*, 2011, 5:2512-2519.
Forrest, S. R., "The Path to Ubiquitous and Low-Cost Organic Electronic Appliances on Plastic," 2004, *Nature*, 428, 911-918, 8 pages.
Geim and Novoselov, "The rise of graphene," *Nature Materials*, 2007, 6:183-191.
Gelinck et al., "Flexible Active-Matrix Displays and Shift Registers Based on Solution-Processed Organic transistors," 2004, *Nat. Mater.*, 3, 106-110, 5 pages.
Gomez-De Arco et al., "Resonant micro-Raman spectroscopy of aligned single-walled carbon nanotubes on a-plane sapphire," 2008, *Applied Physics Letters* 93:123112.1-3, 3 pages.
Han et al., "High-frequency graphene voltage amplifier, *Nano Lett*," 2011, 11:3690-3693.
Han et al., "Template-free directional growth of single-walled carbon nanotubes on a- and r-plane sapphire," J. Am. Chem. Soc., 127:5294-5295 (2005).
Hu et al., "Percolation in Transparent and Conducting Carbon Nanotube Networks ," 2004, *Nano Lett.*, 4, 2513-2517, 5 pages.
Huang et al., "Preferential Destruction of Metallic Single-Walled Carbon Nanotubes by Laser Irradiation," 2006, *J. Phys. Chem. B*, 110(14):7316-7320, 5 pages.
Ishikawa et al., "Transparent Electronics Based on Transfer Printed Aligned Carbon Nanotubes on Rigid and Flexible Substrates ," 2008, *ACS Nano*, 3, 73-79, 7 pages.
Ismach et al., "Atomic-step-templated formation of single wall carbon nanotube patterns," Angew Chem. Int. Ed., 43:6140-6143 (2004).
Joselevich and Lieber, "Vectorial Growth of Metallic and Semiconducting Single-Wall Carbon Nanotubes," 2002, *Nano Letters*, 2(10):1137-1141, 5 pages.
Ju et al., "37.3: High Performance 2.2" QCIF Full Color AMOLED Display based on Electrophosphorescence, *SID Symposium Digest of Technical Papers*, 33(1):1096-1099, May 2002.
Kim et al., "Raman and IR Spectroscopy of Chemically Processed Single-Walled Carbon Nanotubes," 2005, *Journal of the American Chemical Society*, 127, 15437-15445, 9 pages.
Kim et al., "Realization of a high mobility dual-gated graphene field-effect transistor with Al2O3 dielectric," *Appl. Phys. Lett*, 2009, 94, 062107.
Klauk et al., "Flexible Organic Complementary Circuits," 2005, *IEEE Trans. Electron Devices*, 52, 618-622, 5 pages.
Klinke et al., "Charge transfer induced polarity switching in carbon nanotube transistors," Nano Lett., 5:555-558 (2005).

(56) References Cited

OTHER PUBLICATIONS

Kocabas et al., "Experimental and Theoretical Studies of Transport through Large Scale, Partially Aligned Arrays of Single-Walled Carbon Nanotubes in Thin Film Type Transistors," Nano Lett., 7(5):1195-1202, 2007.
Kocabas et al., "Guided Growth of Large-Scale, Horizontally Aligned Arrays of Single-Walled Carbon Nanotubes and Their Use in Thin-Film Transistors," Small, 1:1110-1116 (2005).
Kong et al., "Alkaline metal-doped n-type semiconducting nanotubes as quantum dots," Appl. Phys. Lett., 77:3977-3979 (2000).
LeMieux et al., "Self-Sorted, Aligned Nanotube Networks for Thin-Film Transistors ," Jul. 2008, Science, 321,101-104, 5 pages.
Li et al., "Large-Area Synthesis of High-Quality and Uniform Graphene Films on Copper Foils," Science, 2009, 324:1312-1314.
Li et al., "Low operating bias and matched input-output characteristics in graphene logic inverters," Nano Lett, 2010, 10:2357-62.
Li et al., "Preferential Growth of Semiconducting Single-Walled Carbon Nanotubes by a Plasma Enhanced CVD Method," 2004, Nano Letters 4(2):317-321, 5 pages.
Liao et al., "High-speed graphene transistors with a self-aligned nanowire gate," Nature, Sep. 2010, 467:305-308.
Liao et al., "Sub-100 nm channel length graphene transistors," Nano Lett, 2010, 10:3952-6.
Lin et al., "100-GHz Transistors from Wafer-Scale Epitaxial Graphene, Science," 2010, 327:662.
Lin et al., "High-Performance Carbon Nanotube Field-Effect Transistor With Tunable Polarities," IEEE Transactions on Nanotechnology, 4:481-489 (2005).
Lin et al., "Wafer-Scale Graphene Integrated Circuit," Science, 2011, 332:1294-1297.
Mahar et al., "Development of Carbon Nanotube-Based Sensors—A Review," 2007, IEEE Sensors Journal, 7(2):266-284, 19 pages.
Meric et al., "Channel length scaling in graphene field-effect transistors studied with pulsed current-voltage measurements," Nano Lett, 2011, 11:1093-7.
Meric et al., "Current saturation in zero-bandgap, top-gated graphene field-effect transistors," Nature Nanotechnol, 2008, 3:654-9.
Moon et al., "Low-Phase-Noise Graphene FETs in Ambipolar RF Applications," Electron Device Letters, IEEE Mar. 2011, 32:270-272.
Moon et al., "Top-Gated Epitaxial Graphene FETs on Si-Face SiC Wafers With a Peak Transconductance of 600 mS/mm," Electron Device Letters, IEEE Apr. 2010, 31(4):260-262.
Neto et al., "The electronic properties of graphene," Reviews of Modern Physics, 2009, 81:109.
Nish et al., "Highly selective dispersion of single-walled carbon nanotubes using aromatic polymers," 2007, Nature Nanotechnology 2:640-646, 7 pages.
Park et al., "Adsorption of Atomic Hydrogen on Single-Walled Carbon Nanotubes," 2005, Journal of Physical Chemistry B 109, 8967-8972, 6 pages.
Park et al., "Generalized Chemical Reactivity of Curved Surfaces: Carbon Nanotubes," 2003, Nano Letters 3, 1273, 5 pages.
Pimparkar et al., "Current-Voltage Characteristics of Long-Channel Nanobundle Thin-Film Transistors: A "Bottom-Up" Perspective ," 2007, Electron Device Lett., 28, 157-160, 4 pages.
Pimparkar et al., "Limits of Performance Gain of Aligned CNT Over Randomized Network: Theoretical Predictions and Experimental Validation ," 2007, Electron Device Lett., 28, 593-595, 3 pages.
Schwierz "Graphene transistors," Nature Nanotechnology, Jul. 2010, 5:487-496.
Seo et al., "Chirality- and Diameter-Dependent Reactivity of NO2 on Carbon Nanotube Walls," 2005, Journal of the American Chemical Society, 127, 15724-15729, 6 pages.
Shim et al., "Polymer functionalization for air-stable n-type carbon nanotube field-effect transistors," J. Am. Chem. Soc., 123:11512-11513 (2001).
Sneli et al., "Application of Amorphous Silicon Field Effect Transistors in Addressable Liquid Crystal Display Panels," 1981, Appl. Phys. Lett., 24, 357-362, 6 pages.
Snow et al., "High-Mobility Carbon-Nanotube Thin-Film Transistors on a Polymeric Substrate ," 2005, Appl. Phys. Lett., 86, 033105-1-033105-3, 3 pages.
Snow et al., "Random Networks of Carbon Nanotubes as an Electronic Material ," Mar. 2003, Appl. Phys. Lett., 82, 145-2147, 3 pages.
Tedetti et al., "Hydroxyl radical-induced photochemical formation of dicarboxylic acids from unsaturated fatty acid (oleic acid) in aqueous solution," 2007, Journal of Photochemistry and Photobiology A, 188:135-139, 5 pages.
Thostenson et al., "Advances in The Science and Technology of Carbon Nanotubes and Their Composites: A Review," 2001, Composites Science and Technology 61:1899-1912, 14 pages.
Uchikoga, S., "Low-Temperature Polycrystalline Silicon Thin-Film Transistor Technologies for System-on-Glass Displays," 2002, MRS Bull., 27, 881-886, 6 pages.
Vijayaraghavan et al., "Metal-Semiconductor Transition in Single-Walled Carbon Nanotubes Induced by Low-Energy Electron Irradiation," 2005, Nano Letters 5(8):1575-1579, 5 pages.
Wang et al., "A high-performance top-gate graphene field-effect transistor based frequency doubler," Appl. Phys. Lett, 2010, 96:173104.
Wang et al., "BN/Graphene/BN Transistors for RF Applications," Electron Device Letters, IEEE 2009, 30:547-549.
Wang et al., "Electronically Selective Chemical Functionalization of Carbon Nanotubes: Correlation between Raman Spectral and Electrical Responses," 2005, Journal of the American Chemical Society 127(32):11460-11468, 9 pages.
Wang et al., "Graphene-Based Ambipolar RF Mixers," IEEE Electron Device Letters, Sep. 2010, 31(9):906-908.
Wu et al., "High-frequency, scaled graphene transistors on diamond-like carbon," Nature, Apr. 2011, 472:74-8.
Xu et al., "Quantum Capactiance Limited Vertical Scaling of Graphene Field-Effect Transistor," ACS Nano, 2011, 5:2340-2347.
Yang et al., "Triple-mode single-transistor graphene amplifier and its applications," ACS Nano, 2010, 4:5532-5538.
Zellner, "Global Aspects of Atmospheric Chemistry," H. Baumgartel, W. Grunbein, F. Hensel, Eds., Topics in Physical Chemistry (Springer, New York, 1999), pp. 10-14, 12 pages.
Zhang et al., "Hydrogenation and Hydrocarbonation and Etching of Single-Walled Carbon Nanotubes," 2006, Journal of the American Chemical Society 128, 6026-6027, 2 pages.
Zhang et al., "Photoisomerization of a Fullerene Dimer," Feb. 2008, Journal of Physical Chemistry C, 112, 2802-2804, 3 pages.
Zhang et al., "Selective Etching of Metallic Carbon Nanotubes by Gas-Phase Reaction," Nov. 2006, Science, 314: 974-977, 5 pages.
Zhang et al., "Self-Aligned Ballistic n-Type Single-Walled Carbon Nanotube Field-Effect Transistors with Adjustable Threshold Voltage," Nano Lett, 2008, 8:3696-3701.
Zhang et al., "Transparent, Conductive, and Flexible Carbon Nanotube Films and Their Application in Organic Light-Emitting Diodes ," 2006, Nano Lett., 6, 1880-1886, 7 pages.
Zheng et al., "Transition of Single-Walled Carbon Nanotubes from Metallic to Semiconducting in Field-Effect Transistors by Hydrogen Plasma Treatment," 2007, Nano Letters, 7(6):1622-1625, 4 pages.
Zhou et al., "Structural Characterization and Diameter-Dependent Oxidative Stability of Single Wall Carbon Nanotubes Synthesized by the Catalytic Decomposition of CO," Dec. 14, 2001, Chemical Physics Letters, 350:6-14, 9 pages.
U.S. Appl. No. 13/740,955, filed Jan. 14, 2013, 62 pages.
UPSTO Transaction History; Apr. 24, 2013; U.S. Appl. No. 12/625,543; 2 pages.
UPSTO Transaction History; Apr. 24, 2013; U.S. Appl. No. 12/728,179; 2 pages.
UPSTO Transaction History; Apr. 24, 2013; U.S. Appl. No. 12/940,674; 1 page.
UPSTO Transaction History; Apr. 24, 2013; U.S. Appl. No. 13/430,457; 1 page.
UPSTO Transaction History; Apr. 24, 2013; U.S. Appl. No. 13/447,105; 1 page.
UPSTO Transaction History; Apr. 24, 2013; U.S. Appl. No. 13/740,955; 1 page.
Ago et al., "Aligned growth of isolated single-walled carbon nanotubes programmed by atomic arrangement of substrate surface," Chemical Physics Letters, 408(4-6):433-438, May 2005.

(56) References Cited

OTHER PUBLICATIONS

Arnold et al., "Enrichment of Single-Walled Carbon Nanotubes by Diameter in Density Gradients," *Nano Lett.* 5(4):713-718, 6 pages, Mar. 2005.
Arnold et al., "Sorting Carbon Nanotubes by Electronic Structure Using Density Differentiation," *Nat. Nanotechnol.*, 1:60-65, Oct. 2006.
Bachtold et al., Logic circuits with carbon nanotube transistors, *Science*, 294:1317-1320 Nov. 2001.
Burke, "AC performance of nanoelectronics: towards a ballistic THz nanotube transistor," *Solid-State Electronics*, 48(10-11): 1981-1986, Oct-Nov. 2004.
Cao et al., "Medium-scale carbon nanotube thin-film integrated circuits on flexible plastic substrates," *Nature*, 454: 495-502, Jul. 2008.
Chaste et al., "Single carbon nanotube transistor at GHz frequency," *Nano Lett.*, 8(2):525-528, Jan. 2008.
Chen et al., Flexible and transparent supercapacitor based on In2O3 nanowire/carbon nanotube heterogeneous films, Jan. 28, 2009, Applied Physics Letters 94, 043113.
Chen et al., "An Integrated Logic Circuit Assembled on a Single Carbon Nanotube," *Science*, 311:1735, Mar. 2006.
Collins et al., "Engineering carbon nanotubes and nanotube circuits using electrical breakdown," *Science*, 292:706-709 (Apr. 2001).
Derycke et al., "Carbon Nanotube Inter- and Intramolecular Logic Gates," *Nano Lett.*, 1(9):453-456, Sep. 2001.
Dimitrakopoulos et al., "Wafer-scale epitaxial graphene growth on the Si-face of hexagonal SiC (0001) for high frequency transistors," *Journal of Vacuum Science & Technology B*, 28(5):985-992, Sep. 2010.
Durkop et al., "Extraordinary Mobility in Semiconducting Carbon Nanotubes," Nano Lett., 4(1):35-39, Dec. 2003 online, print 2004.
Engel et al., "Thin Film Nanotube Transistors Based on Self-Assembled, Aligned, Semiconducting Carbon Nanotube Arrays," ACS Nano, 2(12):2445-2452, Dec. 2008.
Gomez et al., "Scalable light-induced metal to semiconductor conversion of carbon nanotubes," *Nano Lett.*, 9(10):3592-3598, Sep. 2009.
Heaney and Veblen, "Observations of the a-p phase transition in quartz: A review of imaging and diffraction studies and some new results," *American Mineralogist*, 76 :1018-1032, 1991.
Javey et al, "Carbon Nanotube Transistor Arrays for Multistage Complementary Logic and Ring Oscillators," *Nano Lett.*, 2(9):929-932, Jul. 2002.
Javey et al., "Ballistic carbon nanotube field-effect transistors," *Nature*, 424: 654-657, Aug. 2003.
Javey et al., "Carbon Nanotube Field-Effect Transistors with Integrated Ohmic Contacts and High-κ Gate Dielectrics," Nano Lett., 4, 447-450, Feb. 2004.
Javey et al., "Self-Aligned Ballistic Molecular Transistors and Electrically Parallel Nanotube Arrays," *Nano Lett*, 4(7):1319-1322, Jun. 2004.
Kang et al., "High-Performance Electronics Using Dense, Perfectly Aligned Arrays of Single-Walled Carbon Nanotubes," *Nature Nanotech.*, 2: 230-236, Mar. 2007 online, Apr. 2007 print.
Kocabas et al., "High-Frequency Performance of Submicrometer Transistors That Use Aligned Arrays of Single-Walled Carbon Nanotubes," *Nano Lett.*, 9(5): 1937-1943, Apr. 2009.
Kocabas et al., "Radio Frequency Analog Electronics Based on Carbon Nanotube Transistors," *Proc. Natl. Acad. Sci. U.S.A.*, 105(5): 1405-1409, Feb. 2008.
Krupke et al., "Separation of Metallic from Semiconducting Single-Walled Carbon Nanotubes," *Science* 301(5631):344-347, online Jun. 2003, print Jul. 2003.
Li et al., "Carbon Nanotube Transistor Operation at 2.6 GHz," *Nano Lett.*, 4(4): 753-756, Mar. 2004.
Liu et al., "Novel nanotube-on-insulator (NOI) approach toward single-walled carbon nanotube devices," *Nano Lett.*, 6(1): 34-39, 2006, published online Dec. 2005, print 2006.
Liu et al., "Carbon nanotube field-effect inverters," *Appl. Phys. Lett.*, 79(20): 3329-3331, Nov. 2001.
Louarn et al., "Intrinsic current gain cutoff frequency of 30GHz with carbon nanotube transistors," *Appl. Phys. Lett.*, 90(23): 233108-1-233108-3, Jun. 2007.
Nougaret et al., "80 GHz Field-Effect Transistors Produced Using High Purity Semiconducting Single-Walled Carbon Nanotubes," *Appl. Phys. Lett.*, 94, 243505-1-243505-3, Jun. 2009.
Pesetski et al., "Carbon Nanotube Field-Effect Transistor Operation at Microwave Frequencies," *Appl. Phys. Lett.* 88: 113103-1-113103-3, Mar. 2006.
Ryu et al, "CMOS-Analogous Wafer-Scale Nanotube-on-Insulator Approach for Submicrometer Devices and Integrated Circuits Using Aligned Nanotubes," *Nano Letters*, 9(1):189-197, online Dec. 2008, print 2009.
Wang et al., "Analog/RF Performance of Si Nanowire MOSFETs and the Impact of Process Variation," *IEEE Trans. Electron Devices*, 54(6): 1288-1294, Jun. 2007.
Wang et al., "Device study, chemical doping, and logic circuits based on transferred aligned single-walled carbon nanotubes," *Appl. Phys. Lett.*, 93:033101-1-033101-3, Jul. 2008.
Wang et al., "Macroelectronic integrated circuits using high-performance separated carbon nanotube thin-film transistors," *ACS Nano.*, 4(12):7123-7132, Nov. 2010 online, Dec. 2010 print.
Wang et al., "Radio frequency and linearity performance of transistors using high-purity semiconducting carbon nanotubes," *ACS Nano.*, 5(5):4169-4176, Apr. 2011 online, May 2011 print.
Wang et al., "Wafer-Scale fabrication of separated carbon nanotube thin-film transistors for display applications," *Nano Lett.*, 9(12):4285-4291, Nov. 2009 online.
Wu et al., Transparent, Conductive Carbon Nanotube Films, Aug. 27, 2004, Science 305, 1273-1276.
Zhang et al., "Comparison of Graphene Growth on Single-Crystalline and Polycrystalline Ni by Chemical Vapor Deposition," *J. Phys. Chem. Lett.*, 1(20): 3101-3107, Oct. 2010.
Zhou et al., "Band Structure, Phonon Scattering, and the Performance Limit of Single-Walled Carbon Nanotube Transistors," *Phys. Rev. Lett.*, 95, 146805-1-146805-3, Sep. 2005.
PCT/US2011/034691 International Preliminary Report on Patentability, issued Nov. 6, 2012, 9 pages.
PCT/US2011/034691 International Search Report and Written Opinion, mailed Jan. 11, 2012, 13 pages.
PCT/US2012/031006 International Search Report and Written Opinion, mailed Oct. 29, 2012, 8 pages.
Krupke, et al., "Separation of Metallic from Semiconducting Single-Walled Carbon Nanotubes", Science 301, 344-347 (2003).
Shekhar et al., "Ultrahigh Density Alignment of Carbon Nanotube Arrays by Dielectrophoresis", American Chemical Society Nano, vol. 5, No. 3, 1739-1746 (2011).

* cited by examiner

RADIO FREQUENCY DEVICES BASED ON CARBON NANOMATERIALS

CROSS-REFERENCE TO RELATED APPLICATION

This application claims priority to U.S. Application Ser. No. 61/494,765 entitled "Radio Frequency Devices Based on Carbon Nanomaterials," filed on Jun. 8, 2011, which is incorporated by reference herein in its entirety.

FEDERALLY SPONSORED RESEARCH OR DEVELOPMENT

This invention was made with government support under CCF0702204 awarded by the National Science Foundation and 2003-NT-1107 awarded by the Center on Functional Engineered and Nano Architectonics. The government has certain rights in the invention.

TECHNICAL FIELD

This invention relates to radio frequency devices based on carbon nanomaterials, including carbon nanotubes and graphene.

BACKGROUND

The application of carbon nanotubes (CNTs) in advanced electronics has been investigated for over a decade, at least in part because carbon nanotubes offer a combination of small size, high mobility, ballistic transport, large current density, and low intrinsic capacitance. Single-wall carbon nanotubes (SWNTs) have been used in various kinds of integrated circuits such as logic gates, ring oscillators, and decoders. However, due to the coexistence of both metallic and semiconducting nanotubes, the on/off ratio is typically small for the as-made transistors using a large number of nanotubes, and various techniques including electrical breakdown, stripe patterning, or using presorted semiconducting nanotubes have been implemented to boost the on/off ratio of transistors.

Carbon nanotubes have been used in radio frequency (RF) applications, including transistors operating in the gigahertz frequency range. The nanotubes typically used are grown by chemical vapor deposition (CVD), and include a mixture of metallic and semiconducting nanotubes. The presence of the metallic nanotubes causes leakage current in the off-state and results in low on/off ratios. Although for analog/RF application, the on/off ratio is not as crucial as for digital applications, low on/off ratio can still result in low efficiency for applications such as power amplifiers and degrade the transconductance ($g_m$) and cutoff frequency ($f_t$) of the RF transistors. In addition, mismatch between the high resistance of nanotubes and outside conductive elements with large capacitance, as well as difficulty of nanotube assembly and integration, have presented challenges for the practical use of carbon nanotube devices for high frequency electronics.

SUMMARY

RF transistors are fabricated at complete wafer scale using a nanotube deposition technique capable of forming high-density, uniform semiconducting nanotube thin films at complete wafer scale, and electrical characterization reveals that such devices exhibit gigahertz operation, linearity, and large transconductance and current drive.

In one general aspect, fabricating a field-effect transistor includes forming a source electrode probing pad and a drain electrode probing pad on a substrate. The substrate includes a silicon dioxide layer disposed over a silicon wafer, and the probing pads include titanium and are patterned on a surface of the silicon dioxide layer. Aluminum back gates are formed on the surface of the silicon dioxide layer, with each aluminum back gate positioned between a portion of the source electrode probing pad and the drain electrode probing pad. The substrate is heated in oxygen to oxidize the surface of the aluminum, thereby forming a layer of aluminum oxide on the aluminum back gate. The substrate is contacted with a solution including aminopropyltriethoxysilane to couple the aminopropyltriethoxysilane to the aluminum oxide and the silicon dioxide. The substrate is contacted with a solution including semiconducting carbon nanotubes to form a semiconducting nanotube thin film over the aluminum oxide and at least a portion of the silicon dioxide to which the aminopropyltriethoxysilane is coupled, and the semiconducting nanotube thin film forms a conduction channel. Source and drain electrode extensions including palladium are formed. The source and drain electrode extensions are coupled to the source and drain electrode probing pads, respectively, yielding a conduction channel length of less than 1 μm (e.g., between 300 nm and 700 nm or about 500 nm), and carbon nanotubes outside the conduction channel are removed.

Implementations may include one or more of the following features. In some cases, the resistivity of the silicon wafer is at least 5 kΩ·cm. About 95% or at least 95% of the nanotubes in the solution are semiconducting nanotubes. In some cases, at least 98% or at least 99% of the nanotubes in the solution are semiconducting nanotubes. In certain cases, between 93% and 97% of the nanotubes in the solution are semiconducting nanotubes.

Forming the probing pads may include using a contact aligner and lift-off process. Forming the source electrode and drain electrode extensions and the aluminum back gate may include patterning via e-beam writing. In some cases, heating the substrate in oxygen includes heating the substrate to at least 200° C. in oxygen to form a layer of aluminum oxide having a thickness of at least 2 nm (e.g., 3 nm, 4 nm, or 5 nm). Removing carbon nanotubes outside the conduction channel comprises exposing the substrate to an oxygen plasma. Certain implementations include a radiofrequency field-effect transistor formed as described above, and an electronic device including a radiofrequency field-effect transistor formed as described above.

In another general aspect, a radiofrequency field-effect transistor includes a silicon substrate, a silicon dioxide layer formed on a surface of the silicon substrate, a source electrode and a drain electrode formed on the silicon dioxide layer, a gate electrode formed between the source electrode and the gate electrode, and two pairs of channels, each pair of channels defining a first channel between the source electrode and the gate electrode and a second channel between the gate electrode and the drain electrode. A thin film including carbon nanotubes is disposed between the source electrode and the drain electrode and over the gate electrode of each pair of channels. At least (or about) 95% of the carbon nanotubes are semiconducting.

The radiofrequency field-effect transistor is scalably fabricated, and the thin film including the carbon nanotubes may be a separated nanotube network. Implementations may include one or more of the following features. In some cases, at least 98% of the carbon nanotubes are semiconducting. The resistivity of the silicon substrate is at least 50 kΩ·cm. The channel length may be less than 1 μm (e.g., between 300 nm and 700 nm, or 500 nm). A thickness of the silicon dioxide layer may be between 100 nm and 500 nm (e.g., 200 nm or 300 nm), and a thickness of the aluminum oxide layer may be between 20 nm and 60 nm (e.g., 40 nm). The source electrode and the drain electrode may include titanium, palladium, gold, or any combination thereof.

The on/off ratio of the field-effect transistor is less than 10, and the maximum transconductance exceeds 2 mS when $V_{GS}$ is about 0 V. In some cases, the transconductance exceeds 40 mS. In certain cases, the cutoff frequency is about 5 GHz, and a maximum oscillation frequency is about 1.5 GHz. The output characteristics ($I_{DS}$-$V_{DS}$) may be substantially linear between a drain voltage of −1.5 V and a drain voltage of −1 V. In some cases, the radiofrequency field-effect transistor operates linearly up to an input power of 12 dBm. The current drive may be between 10 mA and 20 mA. Other implementations include an electronic device having one or more of the radiofrequency field-effect transistors described herein.

These general and specific aspects may be implemented using a device, system or method, or any combination of devices, systems, or methods. The details of one or more embodiments are set forth in the accompanying drawings and the description below. Other features, objects, and advantages will be apparent from the description and drawings, and from the claims.

DETAILED DESCRIPTION

Figure 1A:
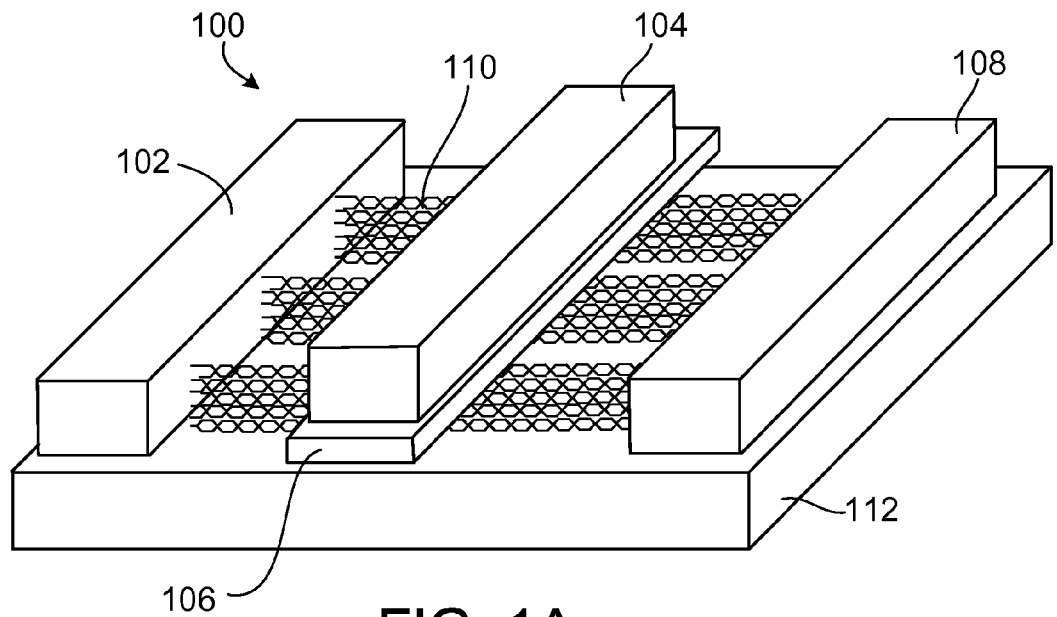
FIG. 1A depicts a RF device on sapphire/quartz.

High performance radio frequency (RF) devices based on nanomaterial thin films including nanotubes (e.g., carbon nanotubes (CNTs) such as multi-wall carbon nanotubes (MWNTs) and single-wall carbon nanotubes (SWNTs)) and graphene are described herein. These devices have high driving currents and reduced parasitic capacitance compared to other nanotube or nanoscale devices. Scalable fabrication of nanotube RF devices on full wafer and polyethylene terephthalate (PET) flexible substrate is demonstrated, and a facile light exposure method to increase the ratio of semiconducting to metallic nanotubes, thereby leading to an improved device on/off ratio, is described.

As noted in U.S. patent application Ser. No. 13/430,457 entitled "High Performance Field-Effect Transistors," filed Mar. 26, 2012, which is incorporated herein by reference, nanomaterial thin films for use in electronic devices can be prepared by a number of processes. The prepared nanomaterial thin films can be transferred to a substrate (with multiple transfers in succession, if necessary, to achieve a desired density of the nanomaterial), and active areas can be defined with lithographical methods generally known in the art by depositing metal pads (source and drain electrodes) and removing the nanomaterial thin films outside the channel area between the source and drain electrodes. Preparation of large-area nanomaterial thin films in this manner allows scalable, registration-free fabrication and integration of nanomaterials into electronic devices. Solution-based deposition, synthesis and transfer of aligned dense arrays of nanotubes, large area graphene film synthesis, and other methods are described below.

Solution-Based Deposition.

Semiconducting nanotubes used to form a nanomaterial thin film can be separated from metallic nanotubes with solution methods (e.g., ultra-high speed centrifugation in a density gradient) to yield separated nanotubes, as described in U.S. Patent Application Publication No. 2011/0101302 and C. Wang et al., both entitled "Wafer-Scale Fabrication of Separated Carbon Nanotube Thin-Film Transistors for Display Applications," Nano Letters, vol. 9, pp. 4285-4291, and both of which are incorporated by reference herein. A semiconducting nanotube thin film is deposited on a substrate through incubation in a separated nanotube solution, followed by rinsing with deionized water. An adhesion layer may be disposed on the substrate before the substrate is contacted with the nanotube solution to improve the adhesion between nanotubes in the solution and the substrate. Suitable adhesive materials include, for example, aminopropyltriethoxysilane (APTES) and poly-L-lysine solution. Nanotube density on the substrate can be selected by adjusting the concentration of the separated nanotube solution.

Synthesis and Transfer of Aligned Dense Arrays of Nanotubes.

In this method, described in U.S. Patent Application Publication No. 2010/0133511 entitled "Integrated Circuits Based on Aligned Nanotubes," U.S. Patent Application Ser. No. 61/117,519 entitled "Transparent Electronics Based on Transfer Printed Aligned Carbon Nanotubes," and K. Ryu et al., "CMOS-Analogous Wafer-Scale Nanotube-on-Insulator Approach for Submicrometer Devices and Integrated Circuits Using Aligned Nanotubes," Nano Letters, vol. 9, pp.

189-197, all of which are incorporated by reference herein, nanotubes are synthesized by chemical vapor deposition on top of a substrate (e.g., sapphire or quartz). The growth of nanotubes is guided by the crystal lattice of the substrate, yielding dense arrays of long, highly aligned nanotubes.

The quartz and sapphire wafers can be annealed at 900° C. and 1100° C., respectively, for a length of time (e.g., 1 to 2 hours) to improve the alignment of nanotubes. In particular, the thermally robust a-plane sapphire wafer can be annealed at 1100° C. at a high ramp rate (45° C./min) while temperature control (ramp rate of <1° C./min) can be used with the 4 inch quartz wafer to reduce or avoid wafer breakage due to the phase transformation of quartz from alpha ($\alpha$) to beta ($\beta$) around 573° C. In some cases, the same total gas flow rate is used for both the ramping up step (3000 sccm Ar and 600 sccm $H_2$) and the growth step (3000 sccm $CH_4$ and 600 sccm $H_2$) to minimize the temperature perturbation. The uniform temperature on the entire wafer can also be a factor in the uniform wafer-scale growth of aligned nanotubes on both quartz and sapphire wafers. A long growth furnace (e.g., 9 feet) with a multi-zone temperature controller (e.g., three or more zones) can be used to improve uniformity.

Many device substrates including polyethylene terephthalate (PET) and glass are not able to withstand temperatures suitable for nanotube growth (e.g., around 900° C.). Accordingly, after nanotubes are grown on a first substrate, such as quartz or sapphire, a facile transfer method can be used to transfer the aligned nanotubes from the first substrate to a target substrate, such as PET, silicon, or silicon dioxide. In one example, a layer, such as poly(methyl methacrylate) (PMMA) or a gold film is deposited over the nanotube array on the first substrate, and then peeled away from the first substrate. The nanotube array is then transferred to the target substrate with a high or nearly perfect yield.

In one example, a 100 nm thick gold film is deposited onto aligned SWNTs on a first substrate to promote conformal contact between nanotubes and the gold film. To transfer the SWNTs to the target substrate, a thermal tape that is adhesive at room temperature but loses its adhesion at a moderate temperature can be used. The thermal tape (e.g., REVAL-PHA, available from Nitto Denko, which loses its adhesion at 120° C.) can be pressed against the original substrate with nanotubes covered by the gold film, and then peeled off together with the gold film and nanotubes. The nanotube/gold film/thermal tape trilayer structure can be pressed against the target substrate, and the tape can then be released by heating to 120° C. The gold film can be subsequently removed using gold etchant, thus leaving an array of aligned SWNTs on the target substrate. Electrode patterning can be performed on the transferred nanotube arrays.

Large-Area Graphene Film Synthesis by Chemical Vapor Deposition and Transfer.

In this method, described in U.S. patent application Ser. No. 12/576,234 entitled "Synthesis of Graphene by Chemical Vapor Deposition" and Y. Zhang et al., "Comparison of Graphene Growth on Single-Crystalline and Polycrystalline Ni by Chemical Vapor Deposition," Journal of Physical Chemistry Letters, vol. 1 (20), pp. 3101-3107, both of which are incorporated by reference herein, graphene films having one or more layers are synthesized by catalytic chemical vapor deposition of carbohydrates on a transition metal surface (e.g., nickel or copper). This method is suitable for large-area graphene synthesis, for example, on a wafer having a diameter of 3 to 4 inches. Graphene films can be released from substrates on which they are formed by etching the substrate to release the graphene film, and then transferring the graphene film to a target substrate (e.g., silicon or silicon dioxide). The transferred graphene films are uniform and continuous, with over 90% of the surface area having only a single graphene layer.

Other methods. Other suitable preparation methods for nanomaterial thin films including, for example, epitaxial graphene growth on silicon carbide substrates, described by C. Dimitrakopoulos et al. in "Wafer-scale epitaxial graphene growth on the Si-face of hexagonal SiC (0001) for high frequency transistors," Journal of Vacuum Science & Technology B, vol. 28, pp. 985-992, which is incorporated by reference herein, and deposition of graphene films from solution, may also be used in the fabrication of electronic devices.

RF Device Fabrication.

After depositing carbon nanotube arrays, mats, graphene, or a combination thereof on the target substrates, devices are built using conventional lithography methods, such as projection and contact photolithography. Carbon nanotube field-effect transistors can be designed in double channel geometry with shared drain lead and underlapped gate electrodes to increase or maximize the number of nanotubes per device area and to decrease or minimize parasitic capacitance (due, for example, to fringing fields between source, gate, and drain leads) per device area. This method is suitable for flexible electronics where the current technologies typically suffer from slow speed operation due to low carrier mobility in organic semiconductors or low fracture strains of inorganic crystalline semiconductors.

Figure 1B:
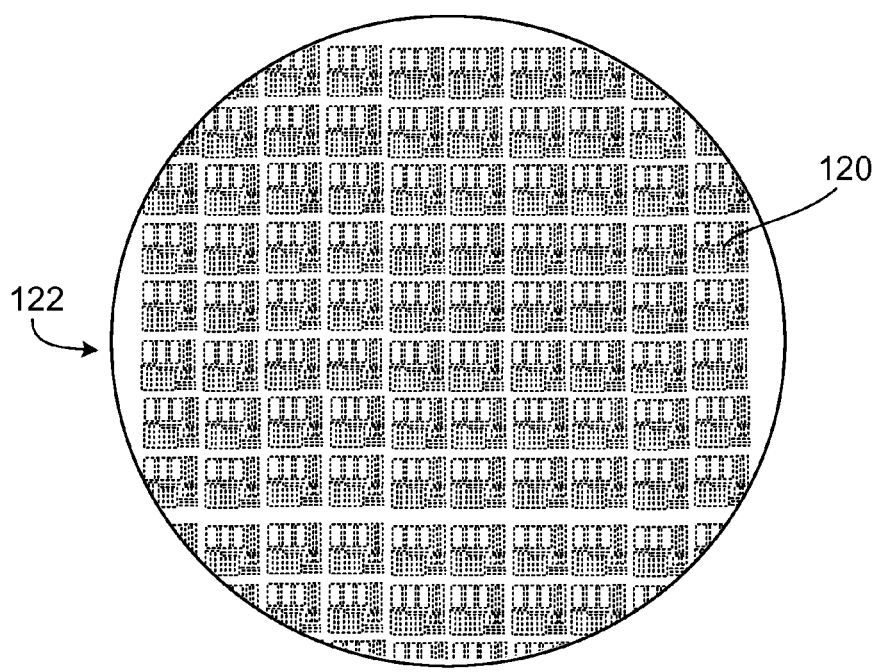
FIG. 1B is an image of RF devices based on aligned nanotubes grown on a 4 inch wafer.

Based on as-grown aligned nanotubes on wafers (e.g., 4 inch quartz and sapphire wafers), RF-devices can be obtained by standard silicon CMOS technology such as projection photolithography using a stepper with 0.5 µm resolution for submicron device patterning, metal deposition for electrodes, and high k dielectric ($HfO_2$ or $Al_2O_3$) deposition for gate dielectric. FIG. 1A depicts RF device 100 with source 102, gate 104 on high k dielectric 106 (e.g., $Al_2O_3$), drain 108, and aligned carbon nanotubes 110 on substrate 112 (e.g., quartz or sapphire). FIG. 1B shows an image of RF devices 120 based on aligned nanotubes grown on a 4 inch quartz wafer 122.

Figure 2A:
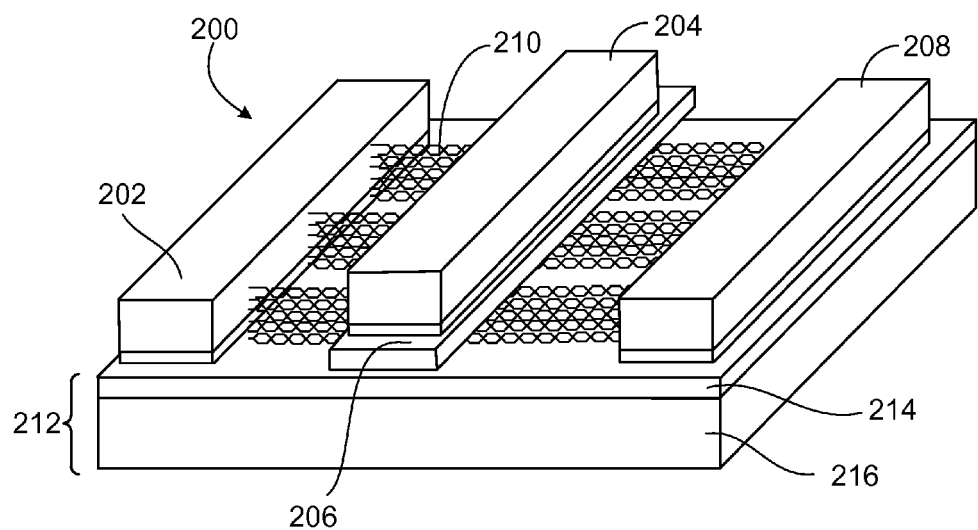
FIG. 2A depicts a RF device on a polyethylene terephthalate (PET) substrate.
Figure 2B:
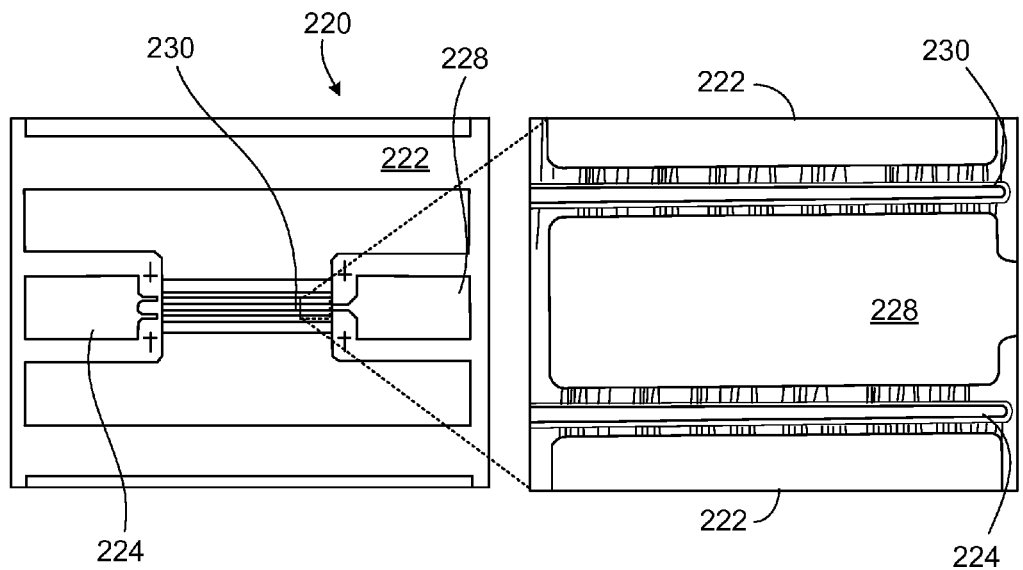
FIG. 2B is an image of a RF device based on transferred aligned nanotubes on a PET substrate. The enlarged portion is a scanning electron microscope (SEM) image of the channel region between the gate and drain electrodes.

FIG. 2A depicts RF device 200 with source 202, gate 204 on high k dielectric 206, drain 208, and aligned carbon nanotubes 210 on substrate 212. Substrate 212 may be a multilayer substrate including, for example, first material 214 (e.g., a resist such as SU-8) formed over second material 216. Second material 216, and thus substrate 212, may be flexible and/or transparent and may include, for example, PET. In cases where substrate 212 cannot sustain elevated temperatures (e.g., 900° C.) for nanotube growth, the transfer of aligned nanotubes may be performed before source/drain patterning, atomic layer deposition, and top-gate patterning. FIG. 2B shows an image of RF device 220 with source 222, gate 224, and drain 228. The enlarged portion shows an SEM image of region 230 between gate 224 and drain 228.

Density of carbon nanotubes (e.g., SWNTs) is a factor in the high frequency performance of an RF device. A high density of nanotubes allows the use of a large number of nanotubes per device, so that device impedance can be matched to the outside elements, and also reduces the effect of parasitic capacitance of device leads, thereby allowing the RF device to approach the intrinsic performance of carbon nanotubes. Additionally, a high nanotube density allows registration-free assembly and integration of carbon nanotube devices with uniform characteristics.

Transistor conductance can be improved by performing more than one (e.g., two, three, or more) nanotube transfer steps to increase the nanotube density on a substrate. In one example, the nanotube density increased linearly from about 5 nanotubes/µm after the first transfer to about 20 nanotubes/

μm after the third transfer. Devices fabricated with two transfers generally showed ~2.2 times more current per unit width than devices fabricated with one transfer. Multiple nanotube transfer can be used to compensate for the decreased current after electrical breakdown, and additional transfers can be performed to achieve even higher current densities.

The aligned arrays and random mats of carbon nanotubes obtained using methods such as these typically include a mixture of semiconducting and metallic nanotubes (e.g., SWNTs) with approximate ratio of 2:1. In one example, semiconducting SWNTs form the controlled conduction channel of a device, whereas metallic SWNTs introduce a shunt resistance to the device. The effect of metallic nanotubes on CNT field-effect transistor (FET) channels can be reduced by employing a scalable, photo-induced process to convert metallic nanotubes into semiconducting or insulating nanotubes. This conversion may be achieved under ambient temperature and pressure environmental conditions (e.g., in the presence of air).

Figure 3A:
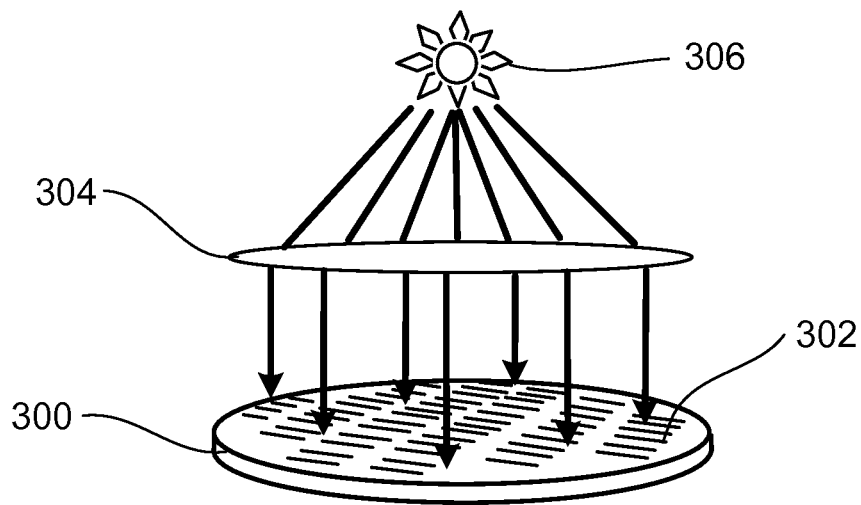
FIG. 3A depicts irradiation of nanotubes in RF devices on a full wafer substrate.
Figure 3B:
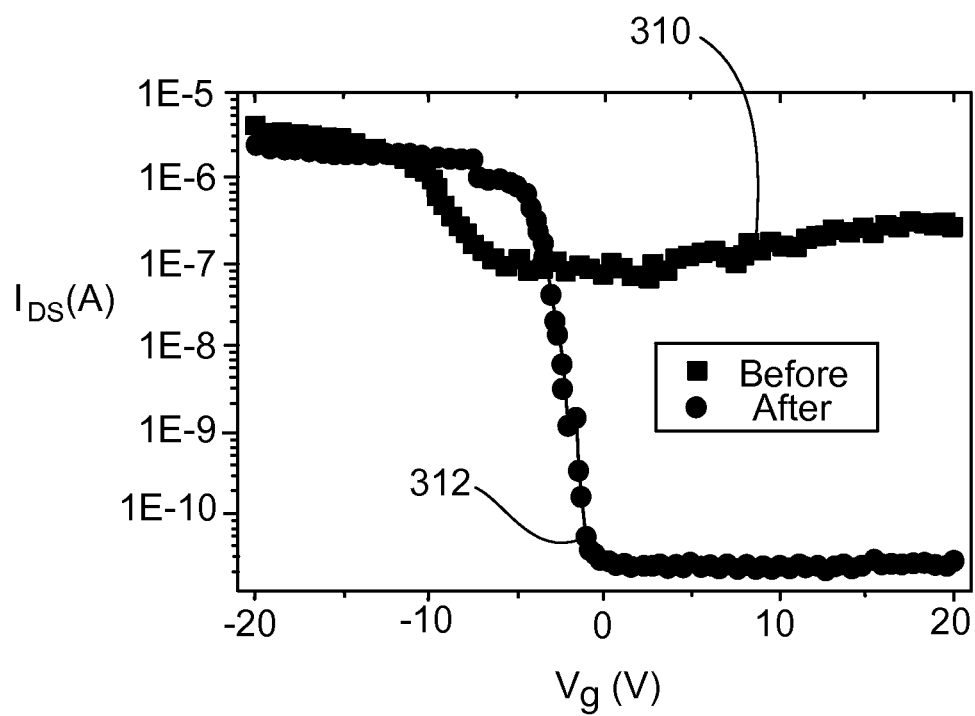
FIG. 3B shows current versus gate voltage characteristic of a CNT field-effect transistor (FET).

FIG. 3A depicts a light irradiation process in which the illumination area of RF devices 300 on wafer 302 is variable according to the lense(s) 304 employed to collimate light 306. Light 306 may be, for example, light from a xenon lamp. FIG. 3B shows current versus gate-voltage ($I_{DS}$–$V_G$) characteristics of a CNT-FET device obtained with $V_{DS}$=0.5 V before (plot 310) and after (plot 312) light irradiation. $I_{On}$ decreased from $4.1 \times 10^{-6}$ A to $2.8 \times 10^{-6}$ A, while $I_{Off}$ dropped from $6.4 \times 10^{-8}$ A to 24 $10^{-12}$ A. This yields an overall change in $I_{On}/I_{Off}$ (channel current) ratio from ~64 to ~$10^5$ in the nanotube transistor by light irradiation without the need of device-by-device procedures such as electrical breakdown. These results suggest the nanotube RF devices formed with irradiated carbon nanotubes include primarily semiconducting nanotubes.

RF Device Design.

Figure 4A:
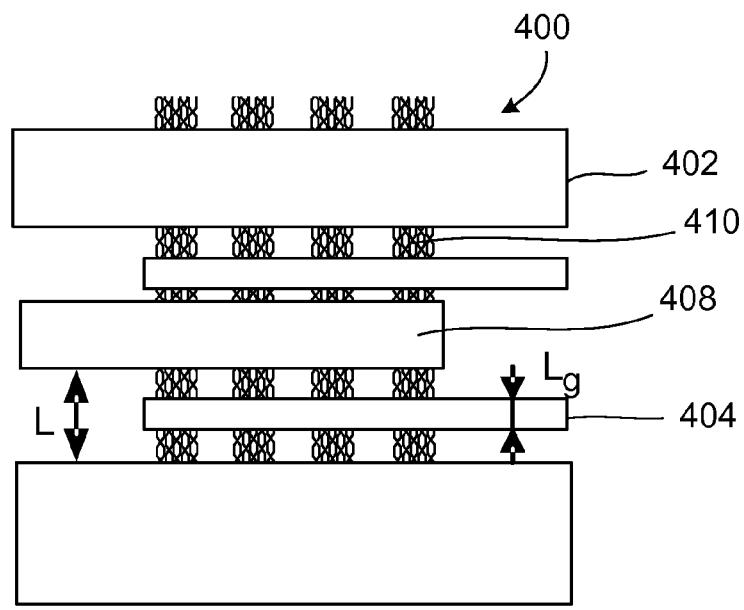
FIG. 4A depicts a nanotube FET layout with top gates.
Figure 4B:
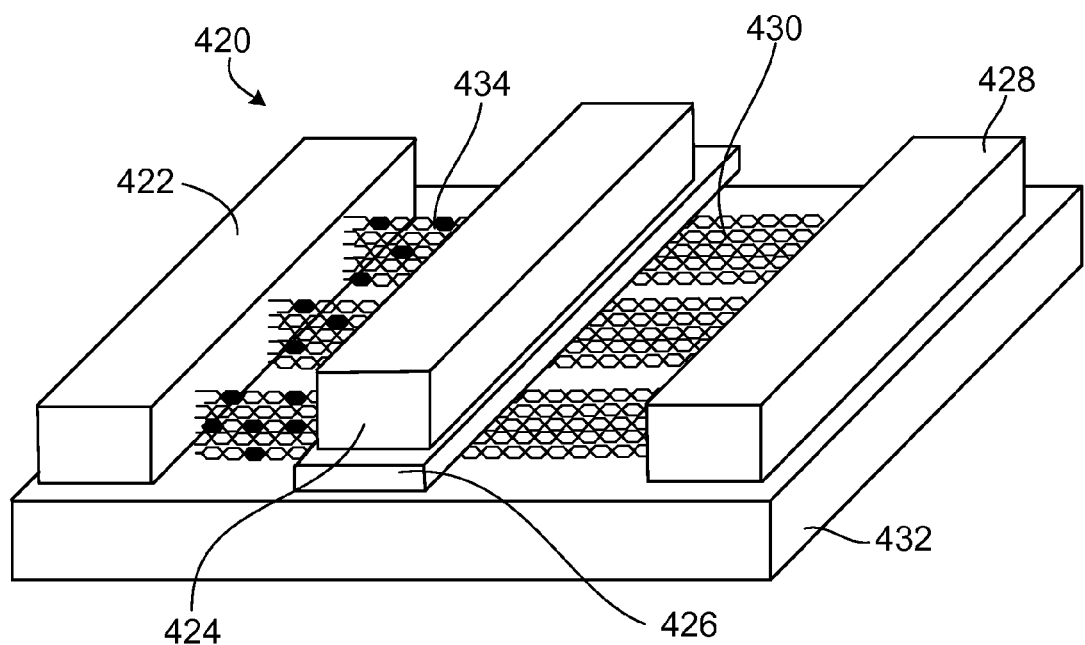
FIG. 4B depicts chemical doping of exposed nanotubes in a nanotube FET.
Figure 4C:
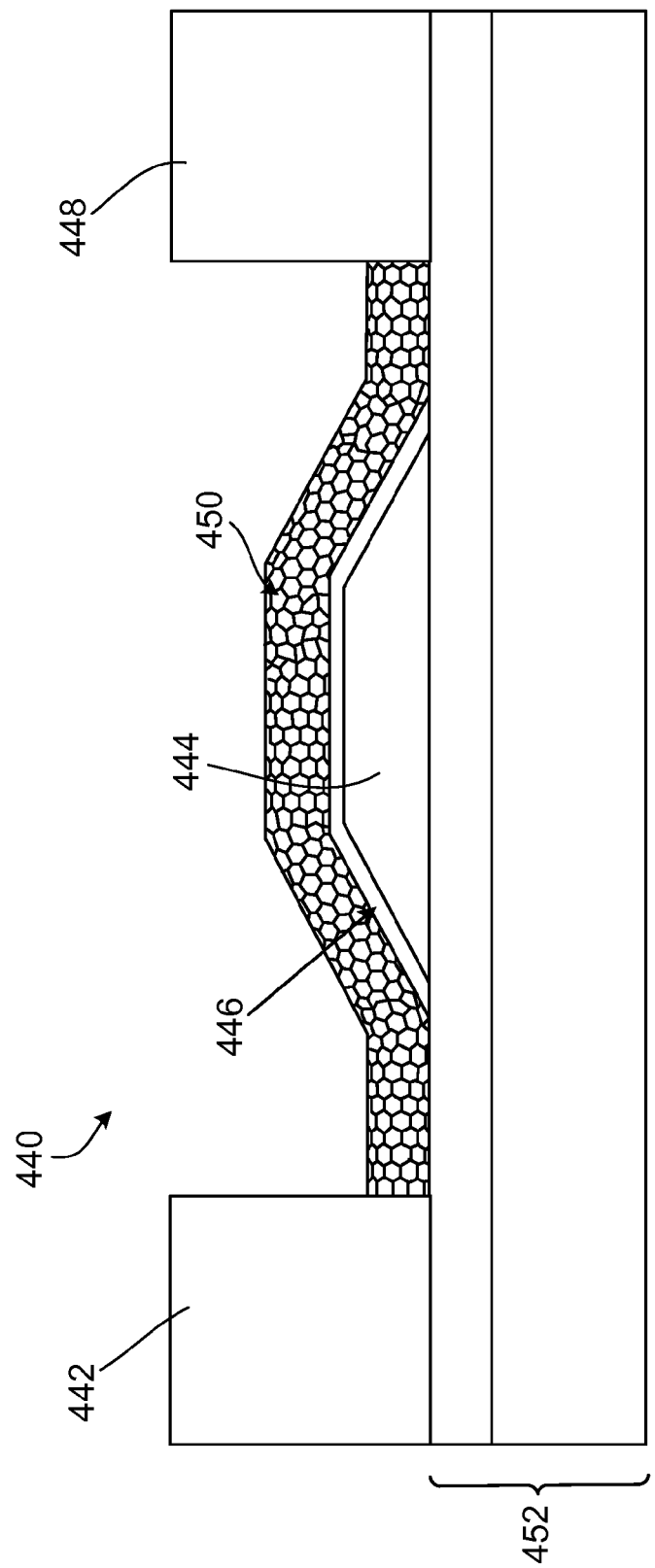
FIG. 4C depicts a back-gated RF structure.

FIGS. 4A-4C depict RF devices having one-dimensional contacts. FIG. 4A depicts a nanotube FET 400 with source 402, gate 404, drain 408, and aligned nanotubes 410 (i.e., without top gates). The double channel geometry of nanotube FET 400 allows the number and/or density of nanotubes to be increased or maximized while allowing the parasitic capacitance per device area to be reduced or minimized. Parasitic capacitance can be further reduced by using underlapped gate design, where gate length $L_g$ is shorter than channel length L. FIG. 4B depicts chemical doping of exposed parts of nanotubes 410 in device 420. Device 420 includes source 422, gate 424 on dielectric material 426, drain 428, and aligned nanotubes 430 on substrate 432. Chemical doping of nanotubes 430 with dopant 434 can reduce contact resistance and alter device polarity. In addition, as shown in FIG. 4C, back-gated device 440, having source 442, gate 444, dielectric material 446, drain 448, and aligned nanotubes 450 on multilayer substrate 452 (including, for example, a dielectric layer such as silicon dioxide formed on a resistive layer, such as resistive silicon) allows the thickness of the gate dielectric to be decreased (e.g., down to 4 nm, 3 nm, or 2 nm), contributing to an increased transconductance of the device.

RF and Linearity Performance of Transistors Using High-Purity Semiconducting Carbon Nanotubes.

High-density, uniform semiconducting nanotube networks were deposited at wafer scale using an APTES-assisted nanotube deposition technique, and RF transistors with channel lengths down to 500 nm were fabricated. These transistors exhibited a cutoff frequency ($f_t$) of 5 GHz and with maximum oscillation frequency ($f_{max}$) of 1.5 GHz; linearity metrics are reported up to 1 GHz. Without the use of active probes to provide the high impedance termination, the measurement bandwidth is not limited, and the linearity measurements can be conducted at the frequencies where the transistors are intended to be operating. These semiconducting nanotube-based transistors may be used as building blocks for highly linear RF electronics and circuit applications.

In some cases, semiconducting nanotubes can be separated from the metallic nanotubes using density gradient ultracentrifugation, resulting in nanotube solution with up to 99% semiconducting nanotube purity (i.e., separated nanotubes). By using such prepurified semiconducting nanotubes, the RF performance is expected to be further improved.

Signals can be amplified at high frequency and also linearly to facilitate signal fidelity. Linearity may become an issue in signal-rich environments due to interference and intermodulation from other communication bands and channels. Transistors based on one-dimensional (1D) materials have been predicted to offer better linearity characteristics than traditional bulk devices, which may be due to the combination of the unique 1D transport properties and the 1D density of states of carriers in the transistor channel. To test the linearity of the nanotube transistor, a common source configuration nanotube transistor may be loaded with a high impedance resistor on the drain, terminated with a high impedance active probe, and driven with two low-frequency tones to characterize the circuit's harmonic distortion. However, if the active probes are used in the study to provide the high impedance termination required for the low current drive nanotube devices, the operational bandwidth may be small (i.e., on the order of kilohertz), and the measured nonlinearity metrics are not valid for the frequencies at which the nanotube transistors are intended to be implemented and operated (e.g., gigahertz frequency).

The device linearity metrics with standard 50Ω terminations have been characterized, and a two-tone test of the nanotube RF devices at gigahertz frequency (an intended operating frequency of the transistor) has been conducted. Nonlinearity measurements have been performed using both single-tone and two-tone, where device linearity figures of merits such as the −1 dB gain compression point (P1dB) and input/output third-order intercept points (IIP3/OIP3 or ITOI/OTOI) were extracted.

Figure 5A:
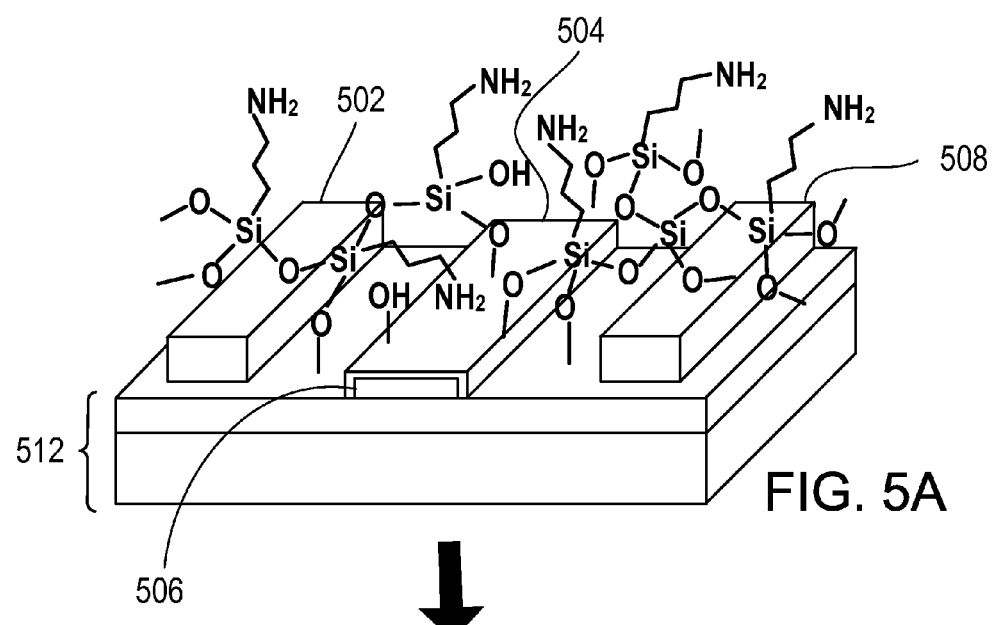
FIGS. 5A and 5B depict a separated nanotube deposition process for separated RF transistor fabrication.
Figure 5B:
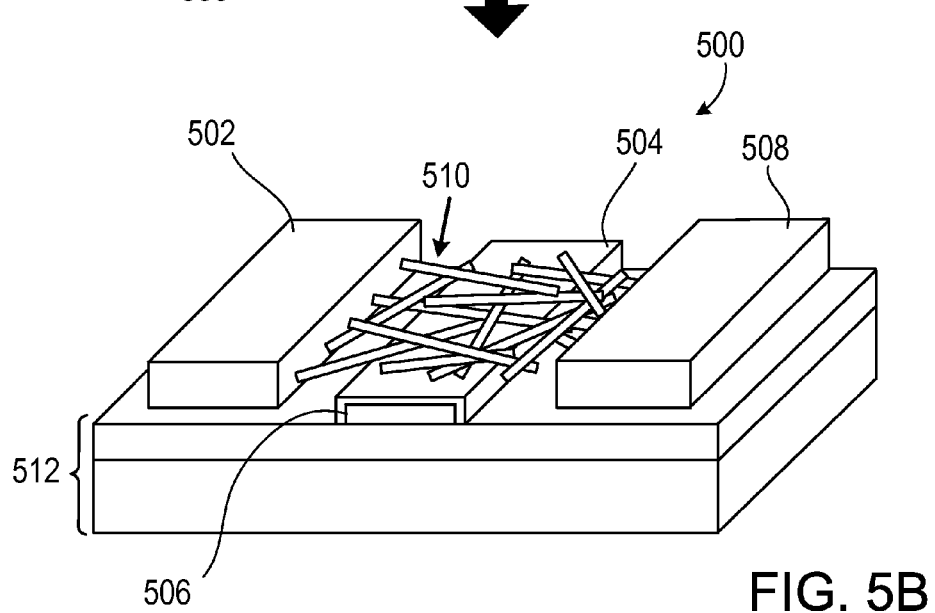

FIGS. 5A and 5B depict the nanotube deposition process and the resulting separated nanotube RF transistor 500. FIG. 5A depicts source 502, gate 504, dielectric 506 formed over the gate, and drain 508 on substrate 512, with APTES depicted as bonded to exposed surfaces. FIG. 5B depicts nanotubes 510 adhered to device 500 between source 502 and drain 508. Nanotubes 510 form a separated nanotube thin film.

In one example of a fabrication process of device 500, substrate 512 is chosen to be a highly resistive silicon wafer (ρ>5 kΩ·cm) with a 200 nm SiO$_2$ layer to ensure minimum parasitics from the substrates. Titanium/gold (0.5/50 nm) probing pads are first patterned using contact aligner and a lift-off process. In some cases, titanium/palladium may be used due to at least in part to its large work function, which can provide Schottky-barrier-free contacts to the nanotubes for hole injection. Next, gate 504 is patterned from aluminum (40 nm) using e-beam writing, and the structure is heated to 200° C. in oxygen to oxidize the surface of the aluminum to form 2-3 nm Al$_2$O$_3$ as dielectric 506. Aluminum back-gates with a thermally oxidized Al$_2$O$_3$ gate dielectric can be used as the gate stacking instead of the traditional top-gate structure with a high-κ dielectric such as Al$_2$O$_3$ and HfO$_2$ deposited by atomic layer deposition (ALD). An advantage is that the thermal oxidization of Al to form Al$_2$O$_3$ is a self-limiting process, resulting in a high-quality, ultrathin gate dielectric, which leads to better gate strength and larger transconductance. In contrast, it may be difficult to obtain a leakage-free $Al_2O_3$ dielectric with such small thickness using ALD. The structure is then immersed into diluted APTES solution (1% APTES in isopropyl alcohol (IPA)) for 10 minutes to functionalize the substrate with amine-terminated monolayer. After that, the structure is rinsed with IPA, blown dry thoroughly, and then immersed into the commercially available 0.01 mg/mL separated nanotube solution with 95% semiconducting nanotubes (IsoNanotubes-S from NanoIntegris, Inc., with an average length of 1 μm) for 30 minutes, after which high density and uniform nanotube networks are formed on top of the structure. With the deposited semiconducting nanotube thin film acting as the conduction channel, the palladium source/drain extensions 502 and 508, respectively, are patterned using e-beam writing to further shrink the device channel length down to 500 nm. E-beam writing plus oxygen plasma is used to remove the unwanted nanotubes outside the device channel region to achieve accurate channel length and width and to reduce leakage in the device.

Figure 5C:
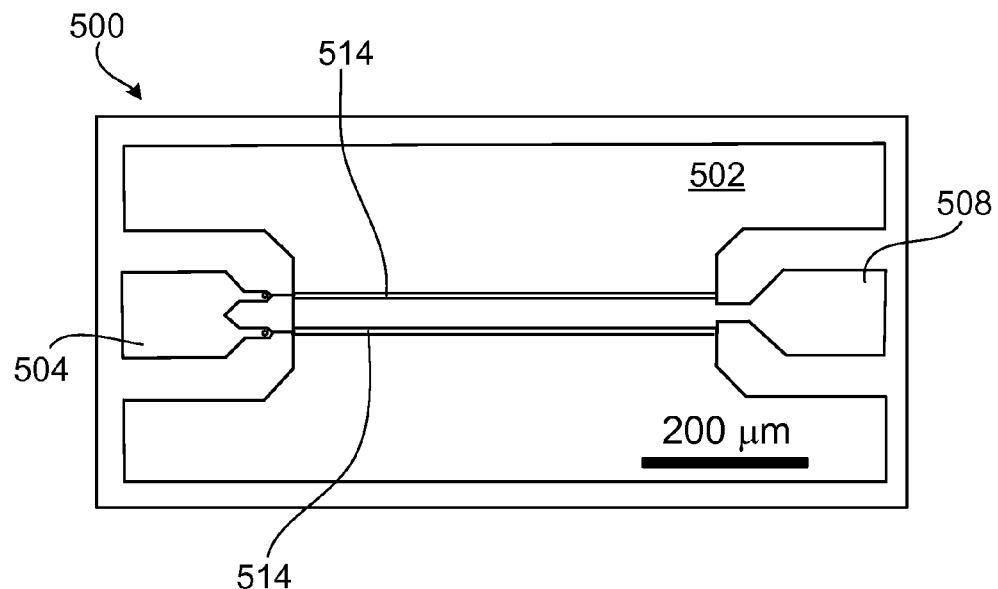
FIG. 5C shows an optical image of the nanotube RF transistor depicted in FIG. 5B.
Figure 5D:
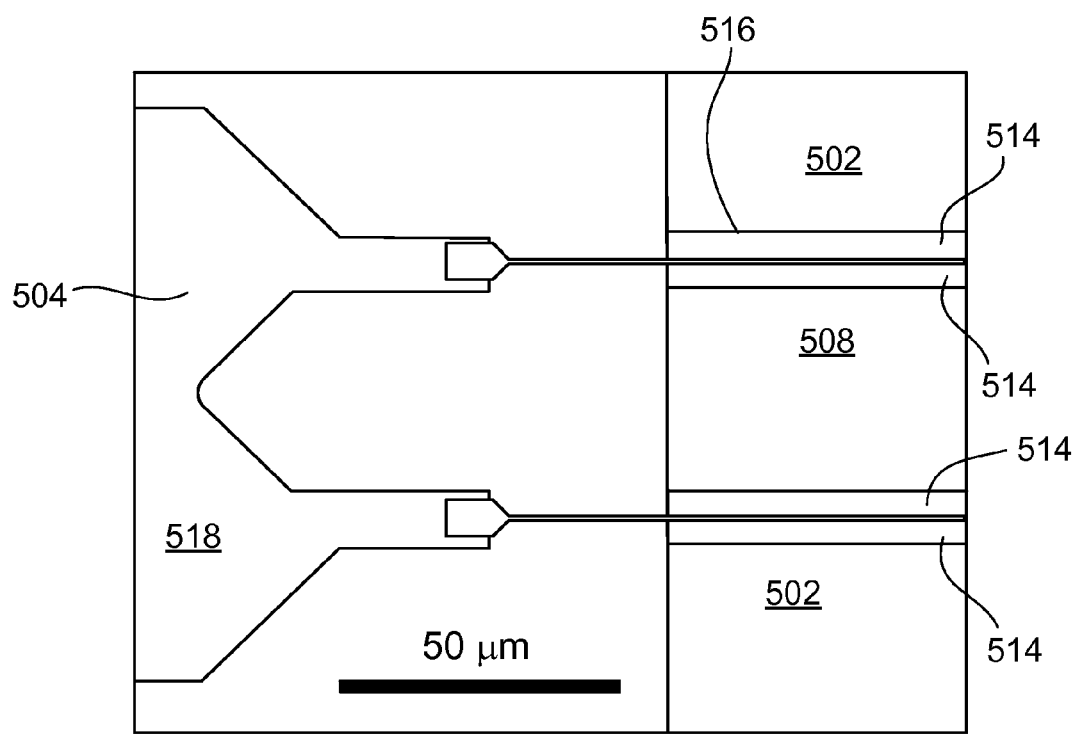
FIG. 5D shows an enlarged portion of the nanotube RF transistor shown in FIG. 5C.
Figure 5E:
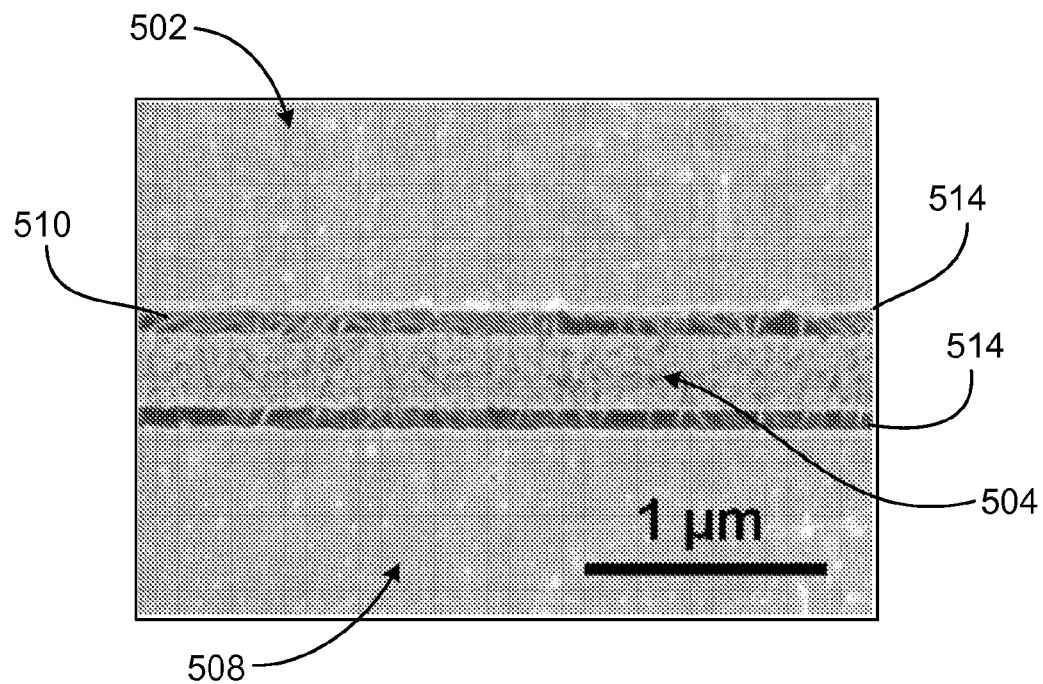
FIG. 5E shows an SEM image of a portion of the nanotube RF transistor of FIG. 5C.
Figure 5F:
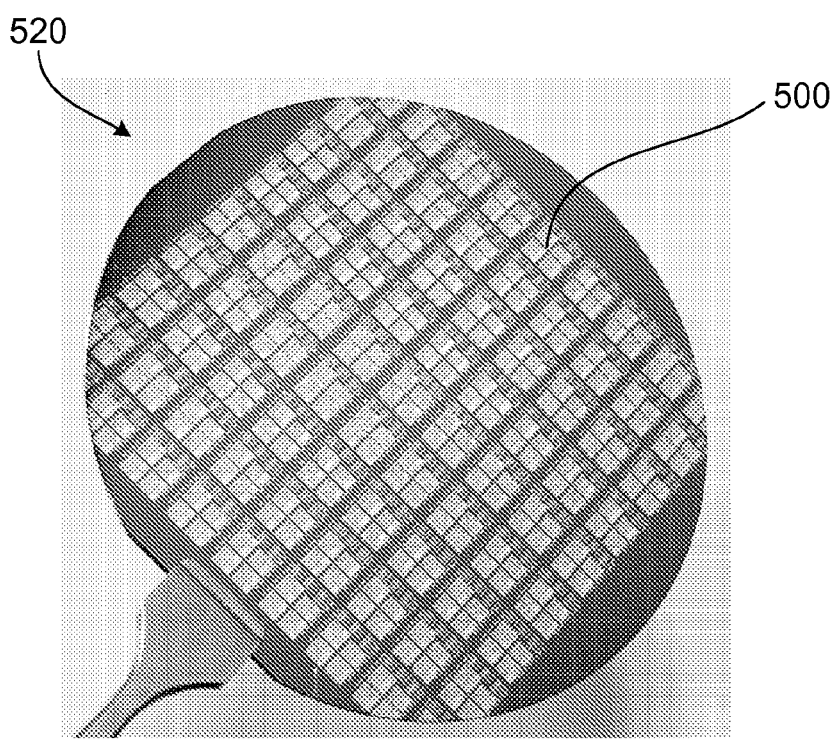
FIG. 5F is an image of a wafer which includes multiple separated nanotube RF transistors shown in FIG. 5C.

FIG. 5C shows an optical microscope image of nanotube RF transistor 500 formed as described above, with source 502, gate 504, and drain 508. Device 500 is configured into the ground-signal-ground (GSG) coplanar waveguide structure so that microwave measurements can be performed. Device 500 includes a pair of nanotube channels 514 with a channel width of 500 μm and a channel length of 500 nm. FIG. 5D shows a further magnified optical microscope image of nanotube RF transistor 500 showing two pairs of channels 514, with source 502, aluminum back gate 504, and drain 508, as well as palladium source drain extensions 516 and titanium/gold pads 518. FIG. 5E is an SEM image showing channels 514 between source 502 and gate 504 and between gate 504 and drain 508 having a channel length of 500 nm. The channel is covered by a high-density semiconducting nanotube network. The above-described APTES-assisted separated nanotube deposition method and the RF transistor fabrication process is scalable and can thus be performed at wafer scale. FIG. 5F is an image of 3 inch wafer 520 with the RF transistors 500.

Figure 6A:
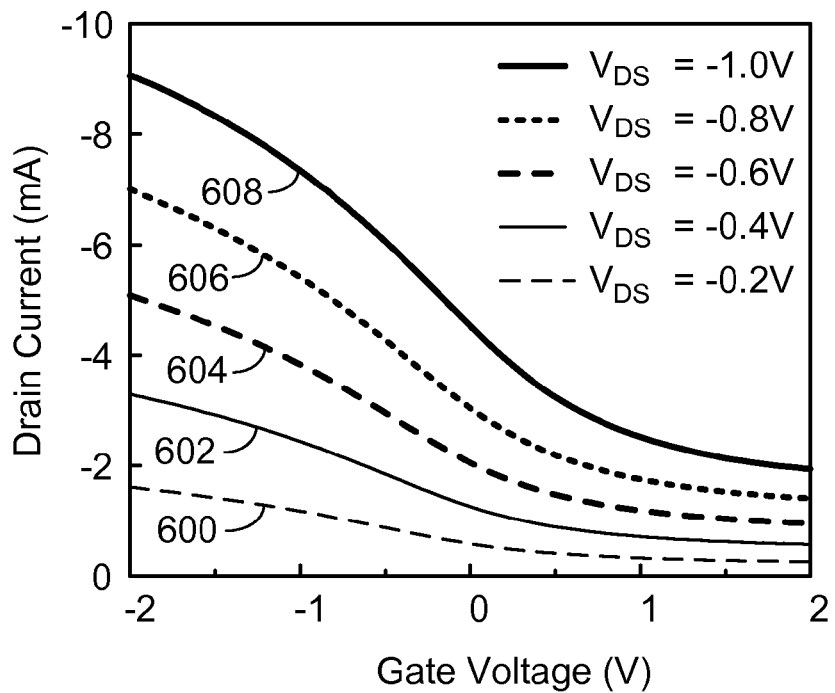
FIGS. 6A-6C show direct current (DC) performance of separated nanotube RF transistors.
Figure 6B:
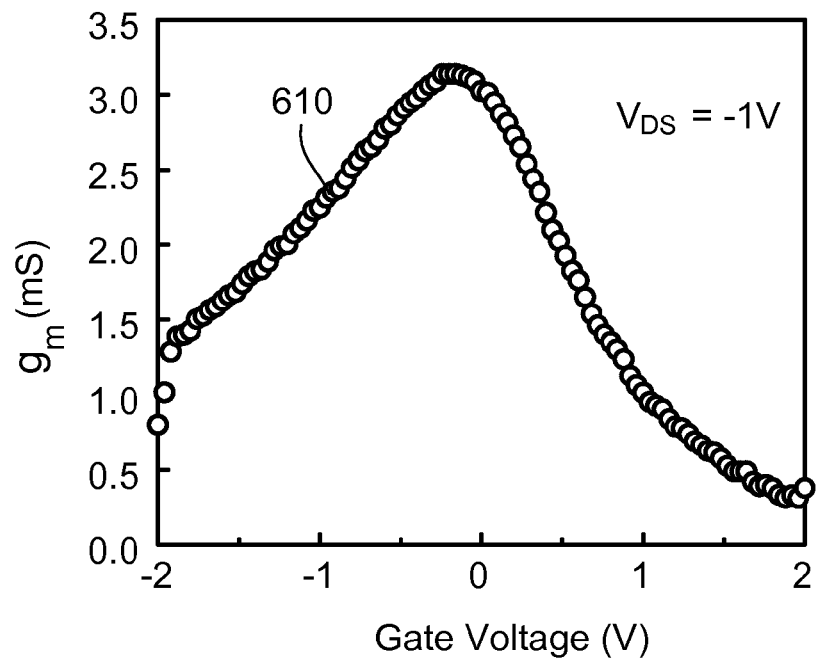
Figure 6C:
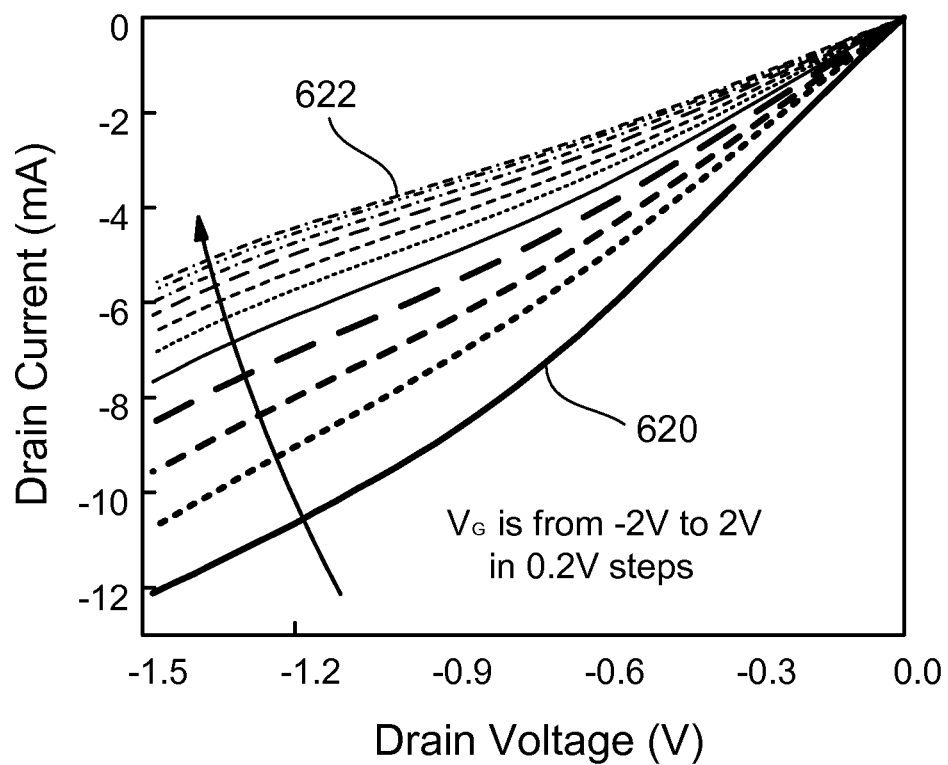

The DC performance of the separated nanotube RF transistors has been characterized, and the results are summarized in FIGS. 6A-6C. FIG. 6A shows transfer characteristics ($I_{DS}$-$V_{GS}$ curves) measured at various drain voltages (plots 600, 602, 604, 606, and 608 correspond to $V_{DS}$=-0.2 V, -0.4 V, -0.6 V, -0.8 V, and -1.0 V, respectively) for one channel of the nanotube RF transistor with W=500 μm and L=500 nm. From the curves, one can find that the on-state current of the device ($I_{on}$) measured at $V_{DS}$=-1 V and $V_{GS}$=-2 V is 9.06 mA, which corresponds to an on-state current density ($I_{on}$/W) of 18.12 μA/μm. The off-state current ($I_{off}$) measured at $V_{DS}$=-1 V and $V_{GS}$=2 V is 1.93 mA, so that the on/off ratio of the device is calculated to be 4.69. The device cannot be completely depleted due to the 500 nm channel length used. For devices using 95% semiconducting nanotubes, the on/off ratio is dependent on the device channel length. As the channel length decreases, the on/off ratio decreases, and the on/off ratio is typically below 10 when a channel length of less than 4 μm is used. Using either longer channel length (>10 μm) or separated nanotube solution with even higher purity (e.g., 99%) of semiconducting nanotubes may lead to a significant improvement in on/off ratio, together with a reduced transconductance. In principle, by using semiconducting nanotubes with higher purity, the device transconductance and thus RF performance may be improved, considering that the nanotubes are substantially the same as the lower purity sample in terms of length, diameter, and band gap. However, for the nanotube samples used in this study, higher-purity semiconducting nanotubes (98 and 99%) tend to have shorter length compared with lower purity ones (95%). Therefore, although the transistors using 98% semiconducting nanotubes can exhibit much better on/off ratio, the on-current density and transconductance can be lower than the transistors using 95% semiconducting nanotubes by a factor of 3-7. This trade-off between on/off ratio and transconductance can be attributed to more tube-to-tube junctions resulting from shorter nanotubes. On the basis of the discussion above, using 95% semiconducting nanotubes may be justified because transconductance is a parameter for the RF device instead of the on/off ratio.

FIG. 6B shows the $g_m$-VGS curve 610 derived from the IDS-VGS characteristics. The maximum $g_m$ is measured to be 2.81 mS when VGS is around 0 V, and the corresponding $g_m$/W is 6.28 μS/μm. FIG. 6C shows output characteristics ($I_{DS}$-$V_{DS}$ curves) of the device measured under different gate biases, from -2V (plot 620) to 2V (plot 622) in steps of 0.2V. The $I_{DS}$-$V_{DS}$ curves appear to be linear at low drain biases, suggesting that ohmic contacts instead of Schottky contacts are formed between the metal electrodes and the nanotubes. Under higher biases, the current begins to saturate, and the saturation behavior is superimposed on the metallic behavior of the nanotube RF transistor. This leads to improved $R_{out}$, which is useful in order to obtain a voltage gain.

Figure 7A:
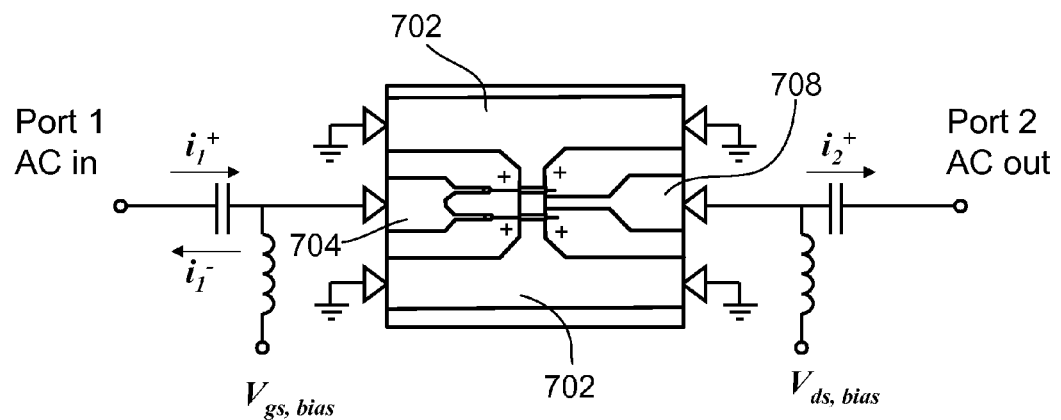
FIG. 7A shows an RF measurement setup.
Figure 7B:
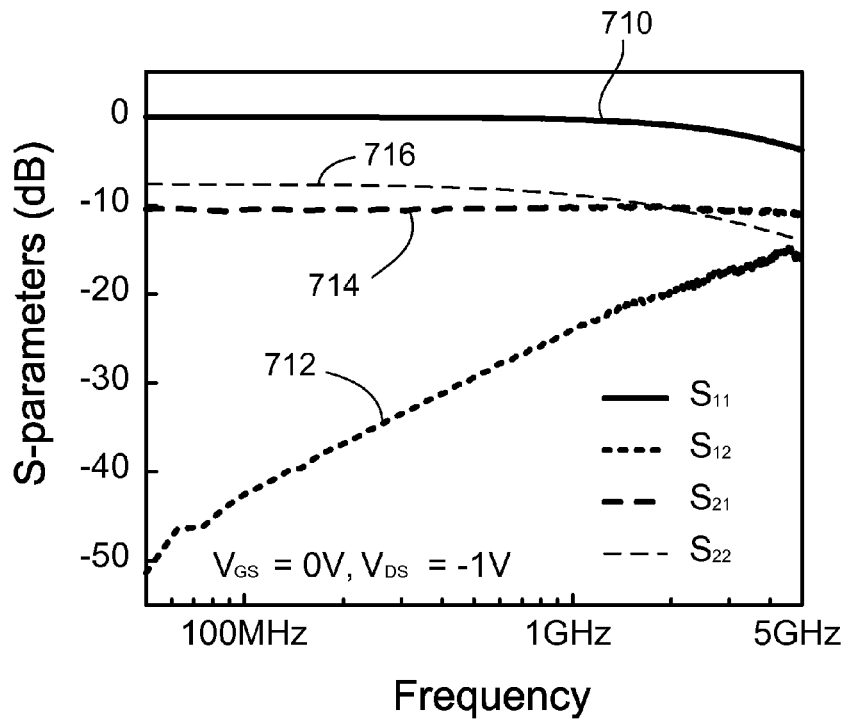
FIGS. 7B-7D show RF characteristics of separated RF nanotube transistors.

The RF performance of the separated nanotube transistor has been further characterized using vector network analyzer (VNA), and the measurement setup is shown in FIG. 7A. The sources 702 are grounded, and the DC biases are supplied to the gate terminal 704 and the drain terminal 708 through the bias-T. For the RF measurement, the gate is biased at $V_{GS}$=0 V and the drain is biased at $V_{DS}$=-1 V, as this is the bias condition that gives the maximum $g_m$, as confirmed by the DC measurement. The measured S parameters for the separated nanotube RF transistor (dual channel with L=0.5 μm, W=500 μm) from 50 MHz to 5 GHz are plotted in FIG. 7B, with plots 710, 712, 714, and 716 corresponding to $S_{11}$, $S_{12}$, $S_{21}$, and $S_{22}$, respectively. The transistor is biased at $V_{GS}$=0 V and $V_{DS}$=-1 V for maximum $g_m$.

From the S parameters, the $h_{21}$, which corresponds to the current gain, and the maximum available gain ($G_{max}$) can be derived using the following equations $$h_{21} = \frac{-2s_{21}}{(1-s_{11})(1+s_{22})+s_{12}s_{21}} \quad (1)$$

$$G_{max} = \left|\frac{S_{21}}{S_{12}}\right| \text{ for } K<1 \text{ or} \quad (2)$$

$$G_{max} = \left|\frac{S_{21}}{S_{12}}(K-\sqrt{K^2-1})\right| \text{ for } K>1$$

where K is the stability factor that can be calculated using the following equation $$K = \frac{1+|S_{11}S_{22}-S_{12}S_{21}|^2-|S_{11}|^2-|S_{22}|^2}{2|S_{12}S_{21}|} \quad (3)$$

Figure 7C:
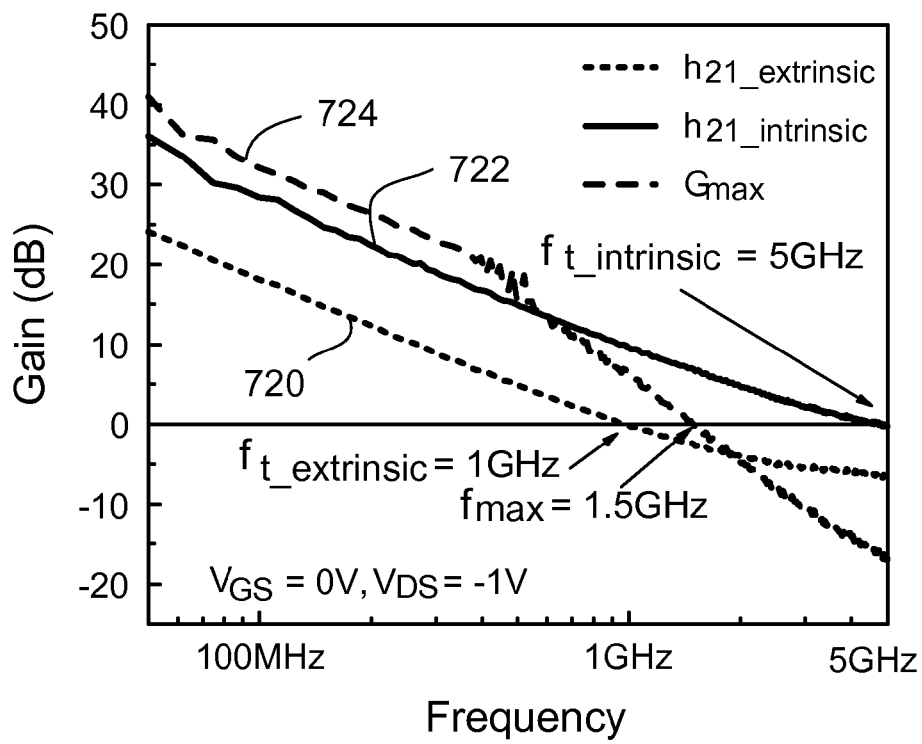

The derived $h_{21}$ (plot 720 extrinsic and plot 722 intrinsic) and $G_{max}$ (plot 724) are plotted as a function of frequency in FIG. 7C, which indicates that, at 1 GHz, the current gain $h_{21}$ drops to 0 dB. So the as-measured (i.e., extrinsic) cutoff frequency ($f_{t\_extrinsic}$) of the separated nanotube RF transistor is 1 GHz. From the $G_{max}$, the unity power gain frequency $f_{max}$ is seen to be 1.5 GHz.

The extrinsic cutoff frequency of the transistor is affected by the parasitic capacitance, and if short-open-load-through (SOLT) de-embedding is performed, the effect from the parasitic capacitance can be ruled out, and the intrinsic cutoff frequency ($f_{t\_intrinsic}$) of the separated nanotube RF transistor can be deduced. In order to remove the parasitic effect and deduce the intrinsic cutoff frequency of the separated nanotube RF transistor, the Device Under Test (DUT) is de-embedded. A short/open scheme is used for this purpose, and the intrinsic device is de-embedded according to the following equation $$Y_{device\_intrinsic} = ((Y_{meas} - Y_{open})^{-1} - (Y_{short} - Y_{open})^{-1})^{-1},$$

where the S parameters for the measured device, open, and short structures are converted to Y parameters, and the intrinsic S parameters of the device are in turn converted back from the intrinsic Y parameters derived using the above equation. A "through" structure would not have modified the results considerably for the frequency regime of interest. The de-embedding open/short structures are done by actual on-die probing measurements, where the open/short structures are fabricated on the same wafer with the separated nanotube RF transistors, and with the same dimensions.

On the basis of the SOLT de-embedding scheme described above, the intrinsic $h_{21}$ of the separated nanotube RF transistor, shown as plot 722 in FIG. 7C, can be deduced. From FIG. 7C, the intrinsic cutoff frequency is derived to be 5 GHz. The frequency response of the separated nanotube RF transistor is better than the transistor using CVD-grown aligned carbon nanotubes with the same device geometry. As discussed below, the improvement can be attributed to the improved $g_m$ as a result of the high-purity semiconducting nanotubes used.

The DC and RF performance of the nanotube RF transistors have been compared using both parallel aligned nanotubes and separated nanotube networks with the same device geometries. For the aligned nanotube platform, on the one hand, the absence of tube-to-tube junctions compared with the separated nanotube networks should help to improve the drive-current density and transconductance. On the other hand, the coexistence of metallic and semiconducting nanotubes with approximately 33% being metallic would degrade the transconductance.

Figure 8A:
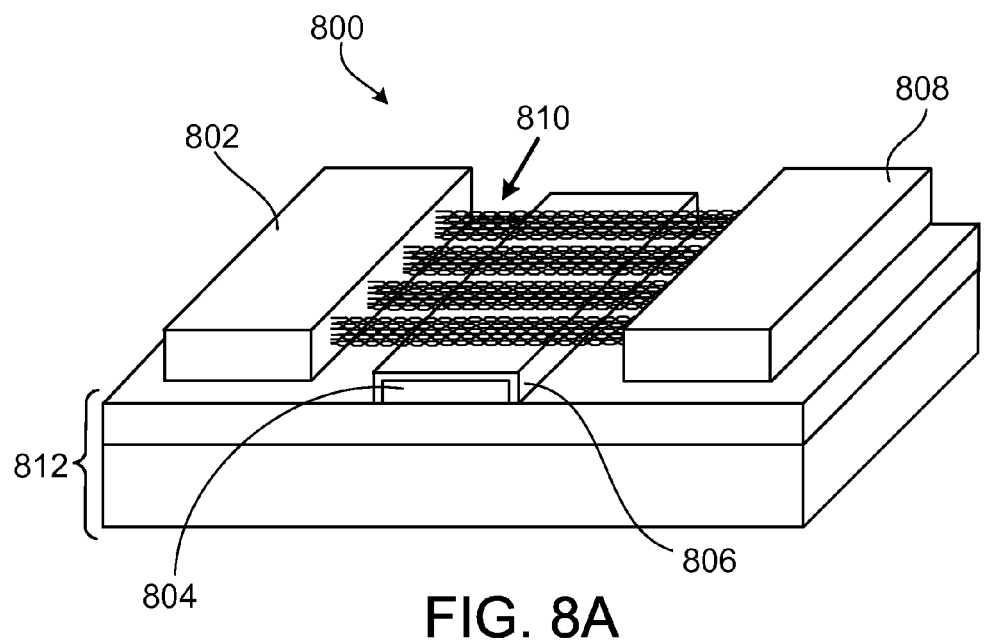
FIG. 8A depicts an aligned nanotube RF transistor.
Figure 8B:
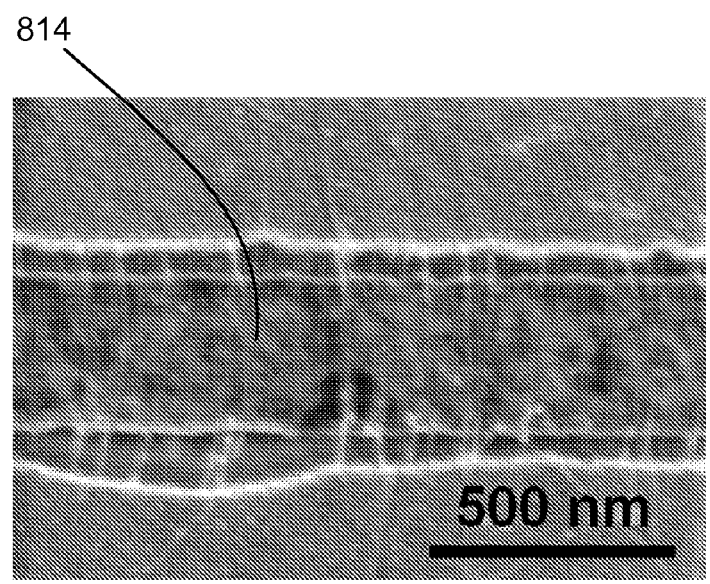
FIG. 8B shows an SEM image of a portion of an aligned nanotube RF transistor.

In one example, the horizontally aligned carbon nanotubes are grown by chemical vapor deposition (CVD) on quartz substrates with evaporated iron as catalyst and methane as feeding gas, and are then transferred to the Si/SiO$_2$ substrate containing the Ti/Au probing pads and Al/Al$_2$O$_3$ back-gates using PMMA. Pd source/drain extensions are then added by e-beam writing similar to the fabrication of the separated nanotube RF transistors. FIG. 8A depicts aligned nanotube transistor 800 with source 802, gate 804, dielectric 806, drain 808, and aligned nanotubes 810 over substrate 812. FIG. 8B shows an SEM image of channel 814 of device 800 depicted in FIG. 8A.

Figure 8C:
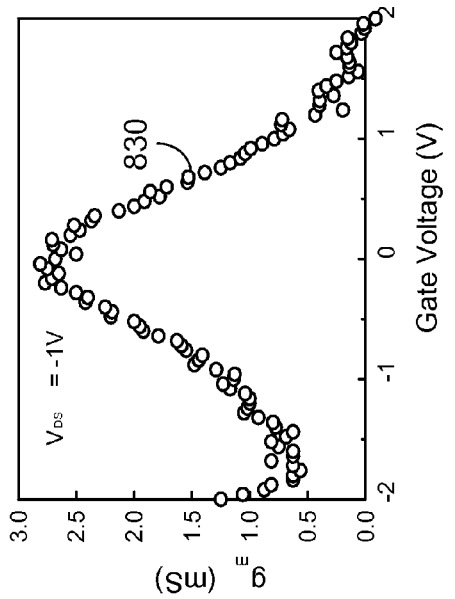
FIGS. 8C-8F show DC and RF performance of an aligned nanotube RF transistor.

The DC transfer characteristics ($I_{DS}$-$V_{GS}$ curves) measured at various drain voltages for an aligned nanotube RF transistor 800 with W=500 μm and L=500 nm are shown in FIG. 8C. From curves 820, 822, 824, 826, and 828, which correspond to $V_{DS}$ of −0.2 V, −0.4 V, −0.6 V, −0.8 V, and −1.0 V, respectively, the on-current of the device ($I_{on}$) measured at $V_{DS}$=−1 V and $V_{GS}$=−2 V, is seen to be 10.79 mA, which corresponds to an on-current density ($I_{on}$/W) of 21.58 μA/μm. The off-state current ($I_{off}$) measured at $V_{DS}$=−1 V and $V_{GS}$=2 V, is 5.72 mA, so that the on/off ratio of the device is calculated to be 1.89. The on/off ratio is smaller than the separated nanotube RF transistors described herein, which is due at least in part to the existence of more metallic nanotubes in the channel.

Figure 8D:
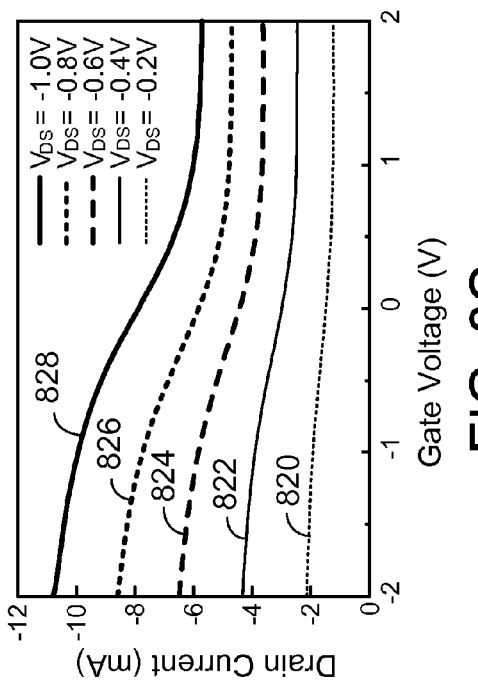
Figure 8E:
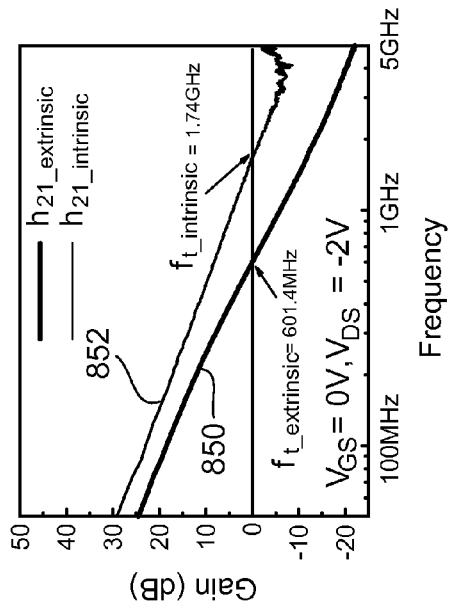

FIG. 8D shows the $g_m$-$V_{GS}$ curve 830 derived from the transfer characteristics. The maximum $g_m$ is 2.81 mS when $V_{GS}$ is around 0 V and the corresponding $g_m$/W is 5.62 μS/μm. FIG. 8E shows the output characteristics ($I_{DS}$-$V_{DS}$ curves) of the device measured under gate biases from −2 V (plot 840) to 2 V (plot 842) in steps of 0.5V.

Figure 8F:
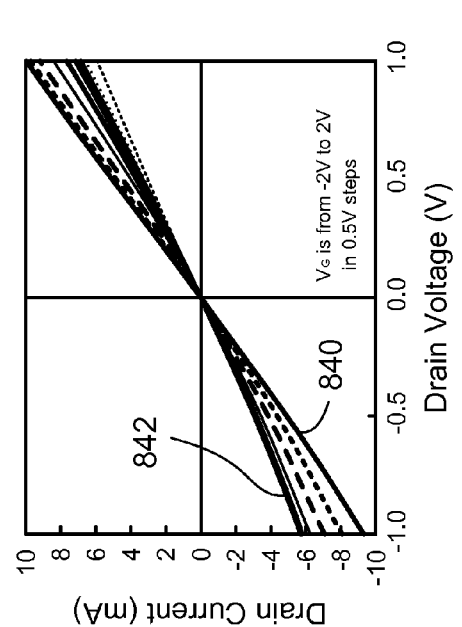
Figure 9A:
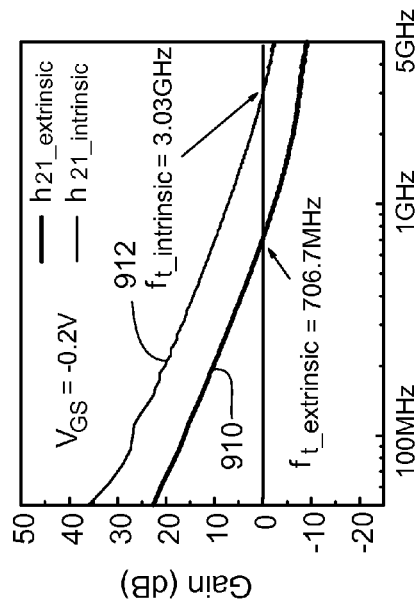
FIGS. 9A-9D show extrinsic and intrinsic current gain of separated nanotube RF transistors under various gate biases.
Figure 9B:
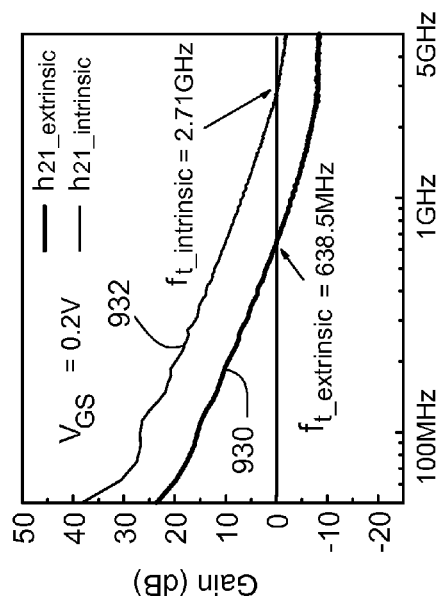
Figure 9C:
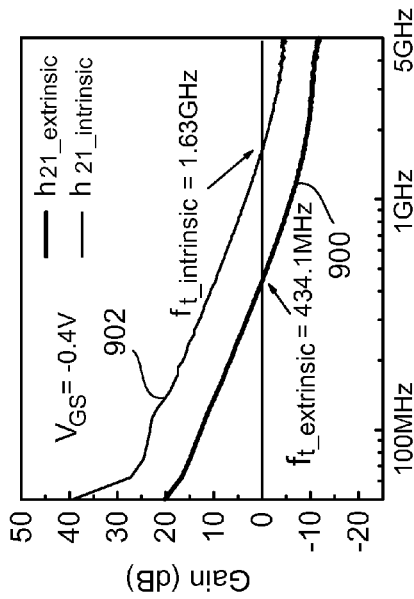
Figure 9D:
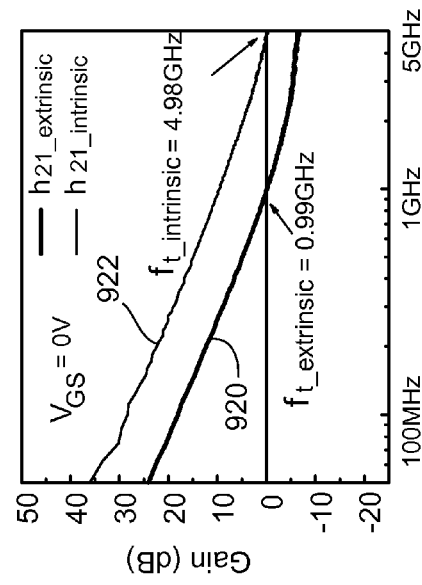

The RF performance of the transistor has been further characterized using vector network analyzer (VNA). For the measurement, the gate is biased at $V_{GS}$=0 V and the drain is biased at $V_{DS}$=−2 V, as this the bias condition that gives the maximum $g_m$, as confirmed by the DC measurement. The $h_{21}$ derived from the measured S parameters from 50 MHz to 5 GHz are plotted in FIG. 8F. At around 600 MHz, the current gain drops to 0 dB, so the extrinsic cut-off frequency of the aligned nanotube RF transistor (plot 850) is 600 MHz. After SOLT de-embedding, the intrinsic cutoff frequency of the aligned nanotube RF transistor (plot 852) is found to be 1.74 GHz.

On the basis of the above comparison, the separated nanotube platform appears to offer better RF performance due at least in part to the use of high percentage semiconducting nanotubes in the channel, which can lead to improved transconductance and cutoff frequency.

Figure 7D:
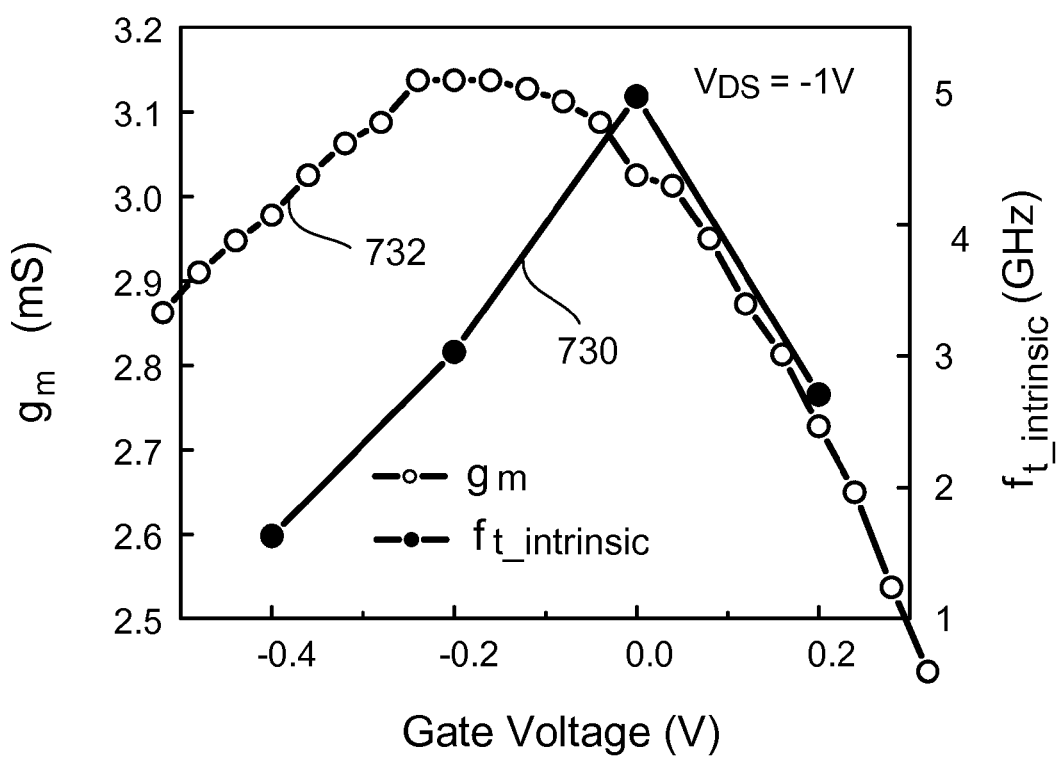

The gate bias dependence of the cutoff frequency of the separated nanotube RF transistor depicted in FIG. 5B is shown in FIG. 7D. The measured $h_{21}$ of the separated nanotube RF transistor exhibits gate bias dependence because $f_t$ is approximately proportional to $g_m$, which is a function of the gate voltage. The extrinsic and intrinsic $h_{21}$ of the separated nanotube transistor measured at $V_{DS}$=−1 V and $V_{GS}$ equals −0.4 V, −0.2 V, 0 V, and 0.2 V are shown in FIGS. 9A-D, respectively, with plots 900, 910, 920, and 930 showing extrinsic values and plots 902, 912, 922, and 932 showing intrinsic values. From the results, $f_t$ is seen to be at its maximum when $V_{GS}$=0 V.

Figure 10:
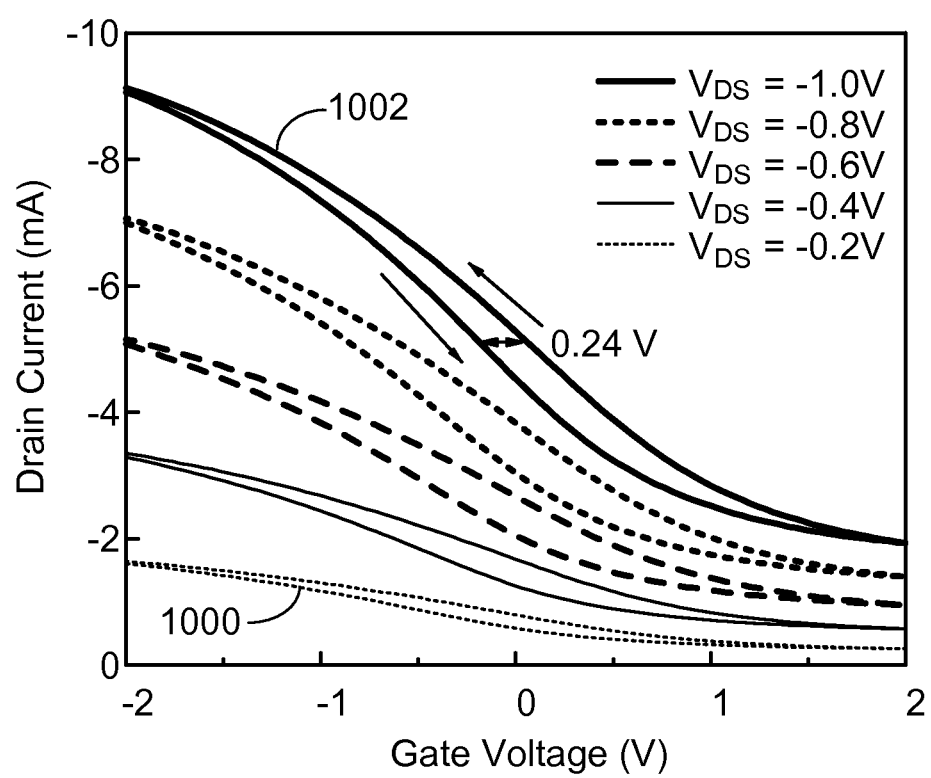
FIG. 10 shows transfer characteristics of separated nanotube RF transistors measured with forward and backward gate voltage sweeps.

As the gate voltage varies from −0.4 to 0.2 V, the measured cutoff frequency of the device also varies and peaks at $V_{GS}$=0 V, as shown in plot 730 of FIG. 7D. The variation of $f_t$ follows the variation of $g_m$, as seen in plot 732, since $f_t$ is proportional to $g_m$. The shift of around 0.24 V between the $g_m$ and $f_t$ curves can be attributed to the device hysteresis. FIG. 10 shows the typical transfer characteristics of the device measured with both forward and backward gate voltage sweeps, with $V_{DS}$ ranging from −0.2 V (plot 1000) to −1.0 V (plot 1002) in steps of −0.2 V. The magnitude of the hysteresis (evaluated at half of $I_{max}$ at $V_{DS}$=−1 V) is measured to be 0.24 V when $V_{GS}$ is swept from −2 to 2 V. This explains the shift of −0.24 V between the $g_m$-$V_{GS}$ and $f_t$-$V_{GS}$ characteristics seen in FIG. 7D. Furthermore, owing to the uniformity of the separated nanotube thin film deposited using APTES, the transistors also behave uniformly. For the six transistors for which the RF performance was characterized, the deduced intrinsic $f_t$ values under the optimal bias conditions only vary from 3.05 to 4.98 GHz, and the average performance from those transistors is 3.86 GHz.

Besides the cutoff frequency, linearity is another factor to be considered for RF transistors. Both single-tone and two-tone measurements have been performed using the test bench setup 1100 illustrated in FIG. 11A. Since the separated nanotube RF transistors provide high current drive on the order of 10 to 20 mA, high impedance probes or terminations are unnecessary. Consequently, the measurement bandwidth is not limited. For the measurement, two tones at adjacent frequencies are applied to the gate of the nanotube RF transistors through a power combiner. The two tones are applied all the way up to the extrinsic $f_t$ limit of the nanotube RF transistors, as reported below, and not just in the kilohertz and sub-kilohertz range.

Besides, despite the high current drive and $g_m$ of our separated nanotube RF transistors, the gain from the device was not focused on, and standard 50Ω terminations were incorporated (for both the spectrum analyzer and the load) in order to observe the high-frequency behavior of the device. Nevertheless, it is worth noting that the absence of gain may affect the linearity measurement in the circuit level since the output signal level is limited. Possible solutions to this issue include increasing the nanotube density in order to improve $g_m$/W or further enlarging the device channel width. In order to achieve gain from the transistors directly driving 50Ω loads, $g_m \times R_{out}$ should be greater than 1, where the total impedance seen at the output node ($R_{out}$) equals the output resistance of the transistor ($r_o$) in parallel with the input impedance of the measurement instrument (50Ω) and the 50Ω load resistor. Assuming $r_o$ is much larger than 50Ω, $R_{out}$ is therefore approximately 25Ω, which means that the device transconductance is advantageously larger than 40 mS so that $g_m \times 25 > 1$.

Figure 11A:
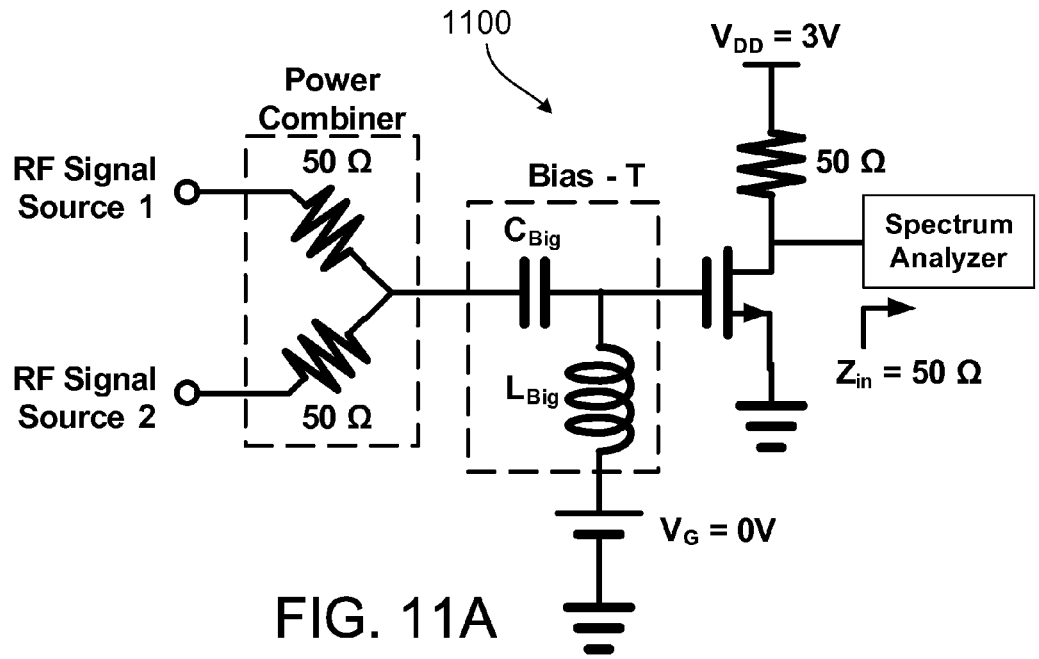
FIG. 11A depicts the two-tone measurement set-up to capture the nonlinearity of separated nanotube RF transistors.
Figure 11B:
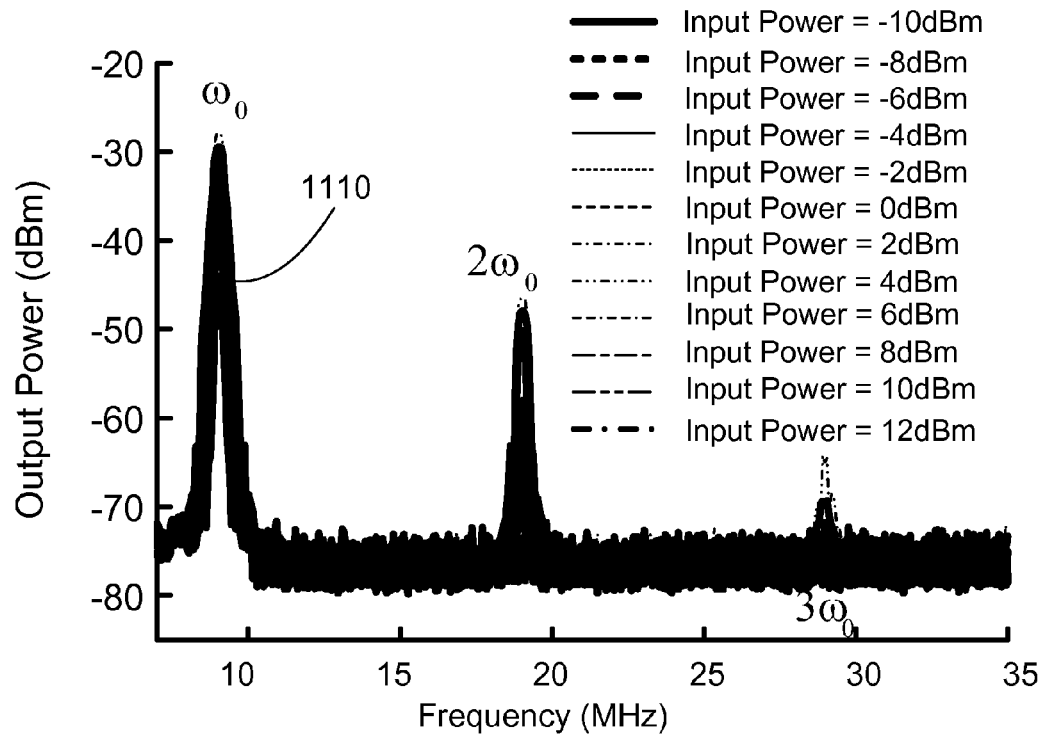
FIGS. 11B-11F show linearity characteristics of separated RF transistors.
Figure 11C:
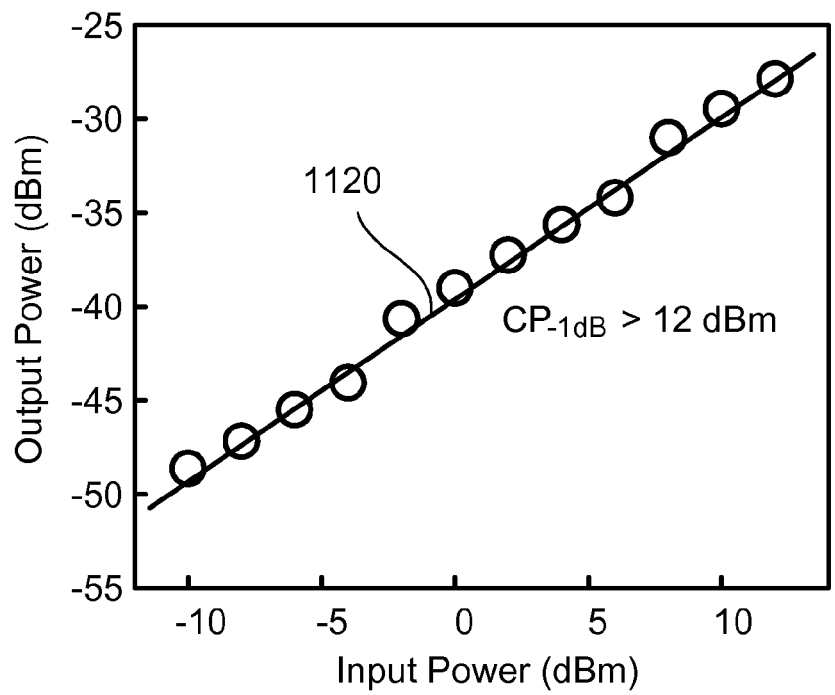
Figure 11D:
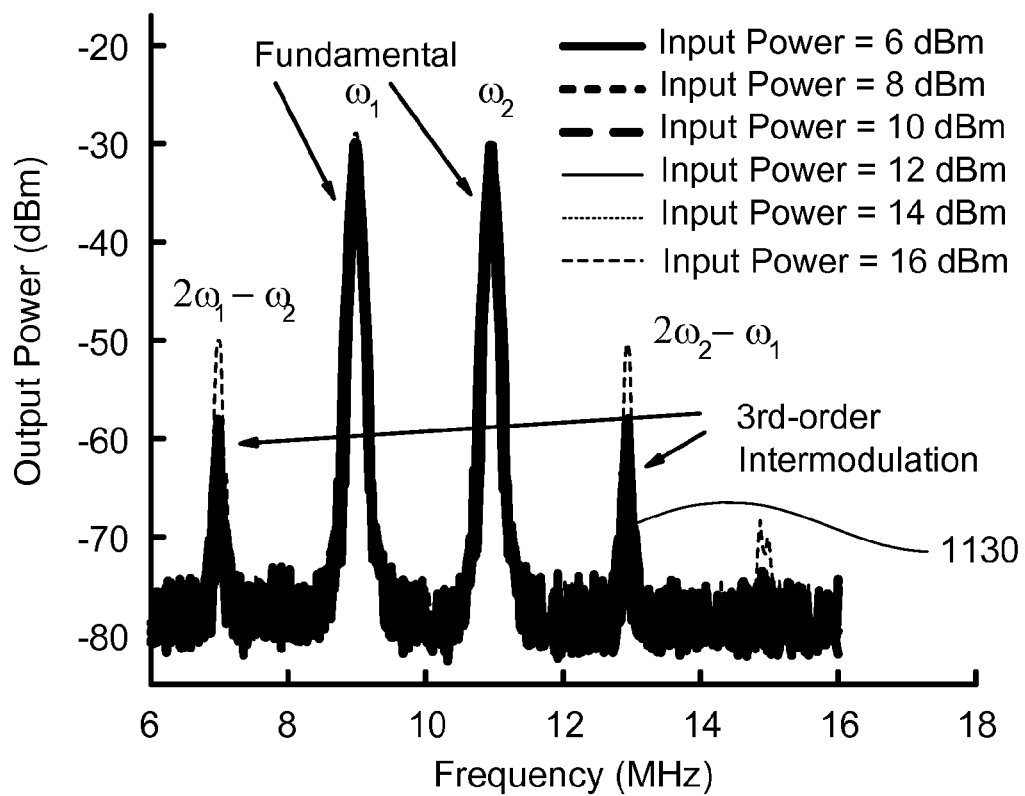
Figure 11E:
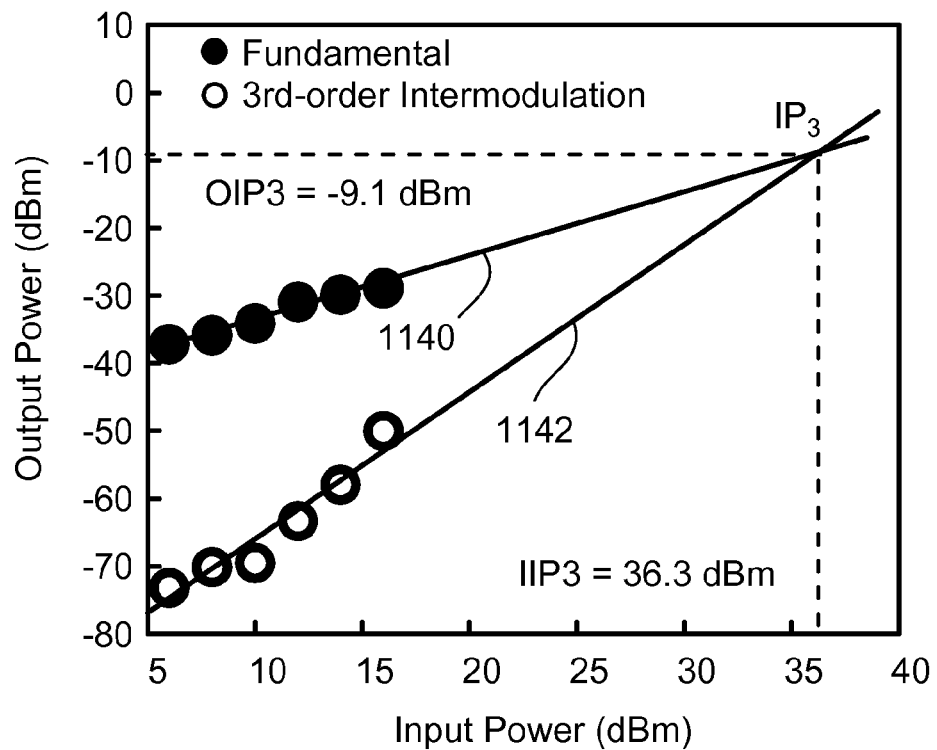

FIG. 11B shows single-tone harmonic distortion characterization results showing the output spectrum of the device with various input power levels from −10 to 12 dBm, overlaid to form plot 1110. Plot 1120 in FIG. 11C shows output power of the fundamental as a function of input power to extract the 1 dB gain compression point (P1dB). FIG. 11D shows two-tone intermodulation characterization results showing the output spectrum with various input power levels from 6 to 16 dBm, overlaid to form plot 1130. FIG. 11E shows output power of the fundamental (plot 1140) and third-order (plot 1142) intermodulation as a function of the input power to extract the IIP3 and OIP3.

For the linearity measurement, the device is characterized for single-tone (second-order and third-order harmonic distortion for 1 dB compression point) as well as two-tone intermodulation distortion (third-order intercept point analysis). FIG. 11B shows the results of the single-tone measurement, where the separated nanotube RF transistor biased with $V_{GS}=0$ V (for peak $g_m$ and $f_T$) and $V_{DS}=-1$ V is driven with a single tone of varying power levels at 9 MHz. From the output spectrum captured using the spectrum analyzer, the fundamental ($\omega_0$), the second-order ($2\omega_0$) and third-order ($3\omega_0$) harmonic components are apparent. If the output power of the fundamental is extracted from FIG. 11B and plotted as a function of input power, the compression point plot can be obtained, as shown in FIG. 11C. This figure indicates that the output power increases linearly as the input power up to 12 dBm, and no gain compression can be observed. This means that the P1dB of the separated nanotube RF transistor is above 12 dBm; that is, the device operates linearly up to an input power of 12 dBm (~16 mW).

FIG. 11D illustrates the intermodulation distortion performance of our separated nanotube RF transistors in accordance with the test-bench presented in FIG. 11A. The two-tone test was conducted with two tones at 9 MHz ($\omega_1$) and 11 MHz ($\omega_2$) to ensure the third-order intermodulations ($\omega_1 + 2\omega_2$ and $2\omega_1 + \omega_2$) that fall close to the tones are observable and measurable accurately. On the basis of FIG. 11D, the power level of the fundamentals and third-order intermodulations are extracted and are plotted as a functional of input power (FIG. 11E). In theory, as the input power increases, the power of the third-order intermodulations increases three times faster than the fundamental. Therefore, the point where the power of the third-order intermodulation is equal to the power of the fundamental can be found via extrapolation. This is the so-called third-order intercept point, and the corresponding input and output power levels are defined as IIP3 and OIP3. From FIG. 11E, the IIP3 is measured to be 36.3 dBm (~4.3 W) and the OIP3 is measured to be −3.3 dB (~0.5 mW) for the separated nanotube RF transistors. The intermodulation distortion measurements can be performed at frequencies near the $f_t$ limit (1 GHz) of the separated nanotube RF transistors.

Figure 11F:
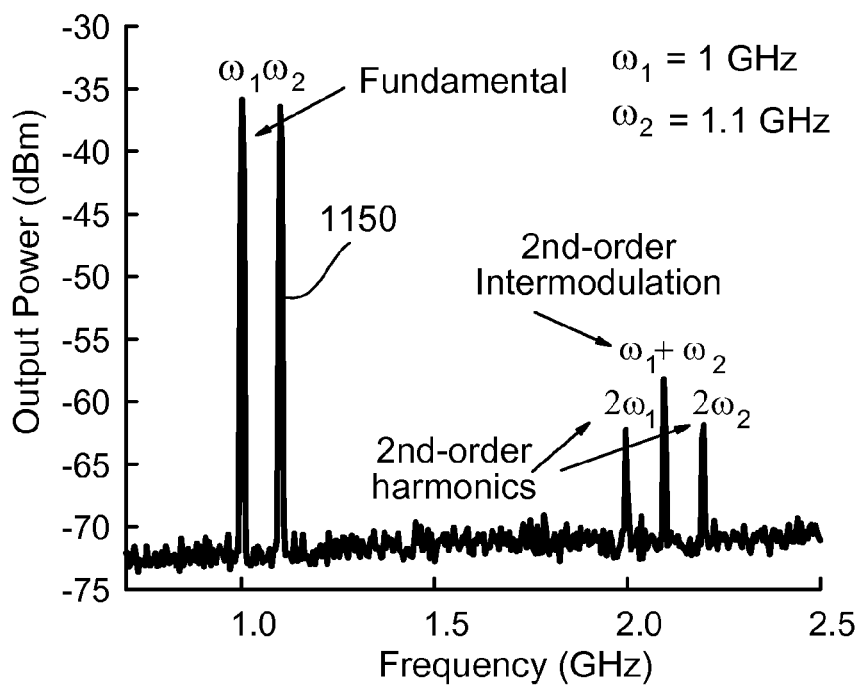

The two-tone intermodulation measurement was conducted with two tones at 1 GHz ($\omega_1$) and 1.1 GHz ($\omega_2$), which are at the extrinsic $f_t$ limit (1 GHz) of the separated nanotube RF transistors. The output spectrum is shown as plot 1150 in FIG. 11F. From the figure, the second-order intermodulation ($\omega_1 + \omega_2$) is visible. The third-order intermodulations ($\omega_1 + 2\omega_2$ and $2\omega_1 + \omega_2$) are already below the noise floor, which is an indication of good linearity at such frequencies. Thus, the power gain does not decrease much even when the input frequency is at 1 GHz, and the third-order intermodulations are much lower (below the noise floor) at this frequency.

Thus, the scalable fabrication of RF transistors with cutoff frequency up to 5 GHz have has demonstrated using separated nanotube networks. With direct 50Ω termination, the linearity figures of merit of the transistors including P1dB and IP3 have been characterized at the frequencies where the transistors are intended to be operating.

A number of embodiments of the invention have been described. Nevertheless, it will be understood that various modifications may be made without departing from the spirit and scope of the invention. Accordingly, other embodiments are within the scope of the following claims.

What is claimed is:

1. A method of fabricating a field-effect transistor, the method comprising:
   forming a source electrode probing pad and a drain electrode probing pad on a substrate, wherein the substrate comprises a silicon dioxide layer disposed over a silicon wafer, and the probing pads comprise titanium and are patterned on a surface of the silicon dioxide layer;
   forming aluminum back gates on the surface of the silicon dioxide layer, each aluminum back gate positioned between a portion of the source electrode probing pad and the drain electrode probing pad;
   heating the substrate in oxygen to oxidize a surface of the aluminum, thereby forming a layer of aluminum oxide on the aluminum back gate;
   contacting the substrate with a solution comprising aminopropyltriethoxysilane to couple the aminopropyltriethoxysilane to the aluminum oxide and the silicon dioxide;
   contacting the substrate with a solution comprising semiconducting carbon nanotubes to form a semiconducting nanotube thin film over the aluminum oxide and at least a portion of the silicon dioxide to which the aminopropyltriethoxysilane is coupled, wherein the semiconducting nanotube thin film forms a conduction channel;
   forming source electrode and drain electrode extensions comprising palladium, the source electrode and drain electrode extensions coupled to the source electrode and drain electrode probing pads, respectively, to yield a conduction channel length of less than 1 μm; and
   removing carbon nanotubes outside the conduction channel, wherein
   at least 95% of the carbon nanotubes are semiconducting, and the transistor has an on/off ratio equivalent to or greater than 4.0, at a drain voltage of less than or equal to −1.0 V, and gate voltages of 2.0 V and −2.0 V, respectively.

2. The method of claim 1, wherein a resistivity of the silicon wafer is at least 5 kΩ·cm.

3. The method of claim 1, wherein forming the probing pads comprises using a contact aligner and lift-off process, and forming the source electrode and drain electrode extensions comprises patterning via e-beam writing.

4. The method of claim 1, wherein forming the aluminum back gate comprises patterning via e-beam writing.

5. The method of claim 1, wherein heating the substrate in oxygen comprises heating the substrate to at least 200° C. in oxygen to form a layer of aluminum oxide having a thickness of at least 2 nm.

6. The method of claim 1, wherein removing carbon nanotubes outside the conduction channel comprises exposing the substrate to an oxygen plasma.

7. A radiofrequency field-effect transistor formed by a method of claim 1.

8. A radiofrequency field-effect transistor comprising:
a silicon substrate;
a silicon dioxide layer formed on a surface of the silicon substrate;
a source electrode and a drain electrode formed on the silicon dioxide layer;
a gate electrode formed between the source electrode and the drain electrode;
two pairs of channels, each pair of channels defining a first channel between the source electrode and the gate electrode and a second channel between the gate electrode and the drain electrode; and
a thin film comprising carbon nanotubes and disposed between the source electrode and the drain electrode and over the gate electrode of each pair of channels, wherein at least 95% of the carbon nanotubes are semiconducting, and the transistor has an on/off ratio equivalent to or greater than 4.0, at a drain voltage of less than or equal to −1.0 V, and gate voltages of 2.0 V and −2.0 V, respectively.

9. The radiofrequency field-effect transistor of claim 8, wherein at least 98% of the carbon nanotubes are semiconducting.

10. The radiofrequency field-effect transistor of claim 8, wherein a resistivity of the silicon substrate is at least 50 kΩ·cm.

11. The radiofrequency field-effect transistor of claim 8, wherein a channel length of the first channel is less than 1 μm.

12. The radiofrequency field-effect transistor of claim 8, wherein a thickness of the silicon dioxide layer is between 100 nm and 500 nm.

13. The radiofrequency field-effect transistor of claim 8, wherein the source electrode and the drain electrode comprise titanium.

14. The radiofrequency field-effect transistor of claim 8, wherein the on/off ratio is less than 10 and a maximum transconductance exceeds 2 mS when the gate voltage $V_{GS}$ is about 0 V.

15. The radiofrequency field-effect transistor of claim 8, wherein a transconductance exceeds 40 mS.

16. The radiofrequency field-effect transistor of claim 8, wherein the transistor has a cutoff frequency of 5 GHz and a maximum oscillation frequency of 1.5 GHz.

17. The radiofrequency field-effect transistor of claim 8, wherein the radiofrequency field-effect transistor is scalably fabricated and the thin film comprising the carbon nanotubes is a separated nanotube network.

18. The radiofrequency field-effect transistor of claim 8, wherein output characteristics ($I_{DS}$-$V_{DS}$) are substantially linear between a drain voltage of −1.5 V and a drain voltage of −1 V.

19. The radiofrequency field-effect transistor of claim 8, wherein the radiofrequency field-effect transistor operates linearly up to an input power of 12 dBm.

20. The radiofrequency field-effect transistor of claim 8, wherein current drive is between 10 mA and 20 mA.

21. An electronic device comprising the radiofrequency field-effect transistor of claim 8.

* * * * *

UNITED STATES PATENT AND TRADEMARK OFFICE
CERTIFICATE OF CORRECTION

| | | |
|---|---|---|
| PATENT NO. | : 8,860,137 B2 | Page 1 of 1 |
| APPLICATION NO. | : 13/492547 | |
| DATED | : October 14, 2014 | |
| INVENTOR(S) | : Chongwu Zhou et al. | |

It is certified that error appears in the above-identified patent and that said Letters Patent is hereby corrected as shown below:

In the Claims

Column 16, line 36, in claim 20, after "wherein" insert -- a --.

Signed and Sealed this
Seventeenth Day of February, 2015

Michelle K. Lee
*Deputy Director of the United States Patent and Trademark Office*